(12) United States Patent
Tanoue

(10) Patent No.: US 12,327,768 B2
(45) Date of Patent: Jun. 10, 2025

(54) SUBSTRATE PROCESSING SYSTEM AND SUBSTRATE PROCESSING METHOD

(71) Applicant: Tokyo Electron Limited, Tokyo (JP)

(72) Inventor: Hayato Tanoue, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 17/817,661

(22) Filed: Aug. 5, 2022

(65) Prior Publication Data

US 2022/0375755 A1     Nov. 24, 2022

Related U.S. Application Data

(63) Continuation of application No. 17/049,068, filed as application No. PCT/JP2019/016125 on Apr. 15, 2019, now Pat. No. 11,450,578.

(30) Foreign Application Priority Data

Apr. 27, 2018   (JP) .................................. 2018-087735
Sep. 13, 2018   (JP) .................................. 2018-171253

(51) Int. Cl.
    *H01L 21/304*     (2006.01)
    *H01L 21/311*     (2006.01)
    (Continued)

(52) U.S. Cl.
    CPC ............ *H01L 22/20* (2013.01); *H01L 21/304* (2013.01); *H01L 21/31111* (2013.01); *H01L 21/67075* (2013.01); *H01L 21/67259* (2013.01)

(58) Field of Classification Search
CPC .. H01L 22/20; H01L 21/304; H01L 21/31111; H01L 21/67075; H01L 21/67259
See application file for complete search history.

(56) References Cited

U.S. PATENT DOCUMENTS

2004/0144487 A1    7/2004   Martinez
2006/0079155 A1    4/2006   Nakamura
(Continued)

FOREIGN PATENT DOCUMENTS

JP          09216152 A     8/1997
JP     2004111606 A     4/2004
(Continued)

OTHER PUBLICATIONS

International Search Report of PCT/JP2019/016125 dated Jun. 25, 2019.

(Continued)

*Primary Examiner* — Victor A Mandala
*Assistant Examiner* — Colleen E Snow
(74) *Attorney, Agent, or Firm* — Shih IP Law Group, PLLC.

(57) ABSTRACT

A substrate processing system includes: a modification layer forming device configured to form a modification layer within a first substrate along a boundary between a peripheral portion to be removed and a central portion of the first substrate; an interface processing device configured to process an interface where the first substrate and a second substrate are bonded in the peripheral portion; a periphery removing device configured to remove the peripheral portion starting from the modification layer; a position detection device configured to detect a position of the modification layer or a position of the interface; and a control device configured to control the modification layer forming device and the interface processing device. The control device controls the position of the interface based on the detected position of the modification layer, or controls the position of the modification layer based on the detected position of the interface.

14 Claims, 24 Drawing Sheets

(51) Int. Cl.
    *H01L 21/66*     (2006.01)
    *H01L 21/67*     (2006.01)

(56)           References Cited

U.S. PATENT DOCUMENTS

| | | | |
|---|---|---|---|
| 2008/0227299 A1* | 9/2008 | Miller | G03F 7/70083 |
| | | | 438/694 |
| 2011/0207294 A1 | 8/2011 | Nakanishi | |
| 2012/0028555 A1 | 2/2012 | Zhang | |
| 2015/0140785 A1 | 5/2015 | Kwak et al. | |
| 2018/0076043 A1 | 3/2018 | Ito | |
| 2018/0079053 A1 | 3/2018 | Zhu | |
| 2020/0343095 A1* | 10/2020 | Harada | B24B 7/228 |

FOREIGN PATENT DOCUMENTS

| | | |
|---|---|---|
| JP | 2008153420 A | 7/2008 |
| JP | 2009131942 A | 6/2009 |
| JP | 2009135342 A | 6/2009 |
| JP | 2011159798 A | 8/2011 |
| JP | 2012064667 A | 3/2012 |
| JP | 2014167966 A | 9/2014 |
| JP | 2017071074 A | 4/2017 |
| JP | 2017191825 A | 10/2017 |
| KR | 10-2015-0007215 A | 1/2015 |

OTHER PUBLICATIONS

English Translation of the Written Opinion of the International Searching Authority for PCT/JP2019/016467 dated Oct. 27, 2020 and original Written Opinion thereof.

\* cited by examiner

SUBSTRATE PROCESSING SYSTEM AND SUBSTRATE PROCESSING METHOD

This is a continuation application of U.S. patent application Ser. No. 17/049,068, filed on Oct. 20, 2020, which is the National Stage filing under 35 U.S.C. § 371 of PCT Ser. No. PCT/JP2019/016125 filed on Apr. 15, 2019, which claims the benefit of Japanese Patent Application Nos. 2018-87735 and 2018-171253 filed on Apr. 27, 2018 and Sep. 13, 2018, respectively, the entire disclosures of which are incorporated herein by reference.

TECHNICAL FIELD

The various aspects and embodiments described herein pertain generally to a substrate processing system and a substrate processing method.

BACKGROUND

It is described in Patent Document 1 that a disk-shaped grinding tool having abrasive grains on an outer peripheral portion thereof is rotated and at least an outer circumferential surface of the grinding tool is brought into linear contact with a semiconductor wafer to grind a circumferential end of the semiconductor wafer into a substantially L-shape. The semiconductor wafer is manufactured by bonding two sheets of silicon wafers.

PRIOR ART DOCUMENT

Patent Document 1: Japanese Patent Laid-open Publication No. H09-216152

DISCLOSURE OF THE INVENTION

Means for Solving the Problems

A substrate processing system configured to process a substrate includes: a modification layer forming device configured to form a modification layer within a first substrate along a boundary between a peripheral portion to be removed and a central portion of the first substrate; an interface processing device configured to perform a predetermined processing on an interface where the first substrate and a second substrate are bonded to each other in the peripheral portion; a periphery removing device configured to remove the peripheral portion starting from the modification layer; a position detection device configured to detect a position of the modification layer formed in the modification layer forming device or a position of the interface processed in the interface processing device; and a control device configured to control the modification layer forming device and the interface processing device. The control device controls the position of the interface processed in the interface processing device based on the position of the modification layer detected by the position detection device, or the control device controls the position of the modification layer formed in the modification layer forming device based on the position of the interface detected by the position detection device.

DETAILED DESCRIPTION

Figure 1:
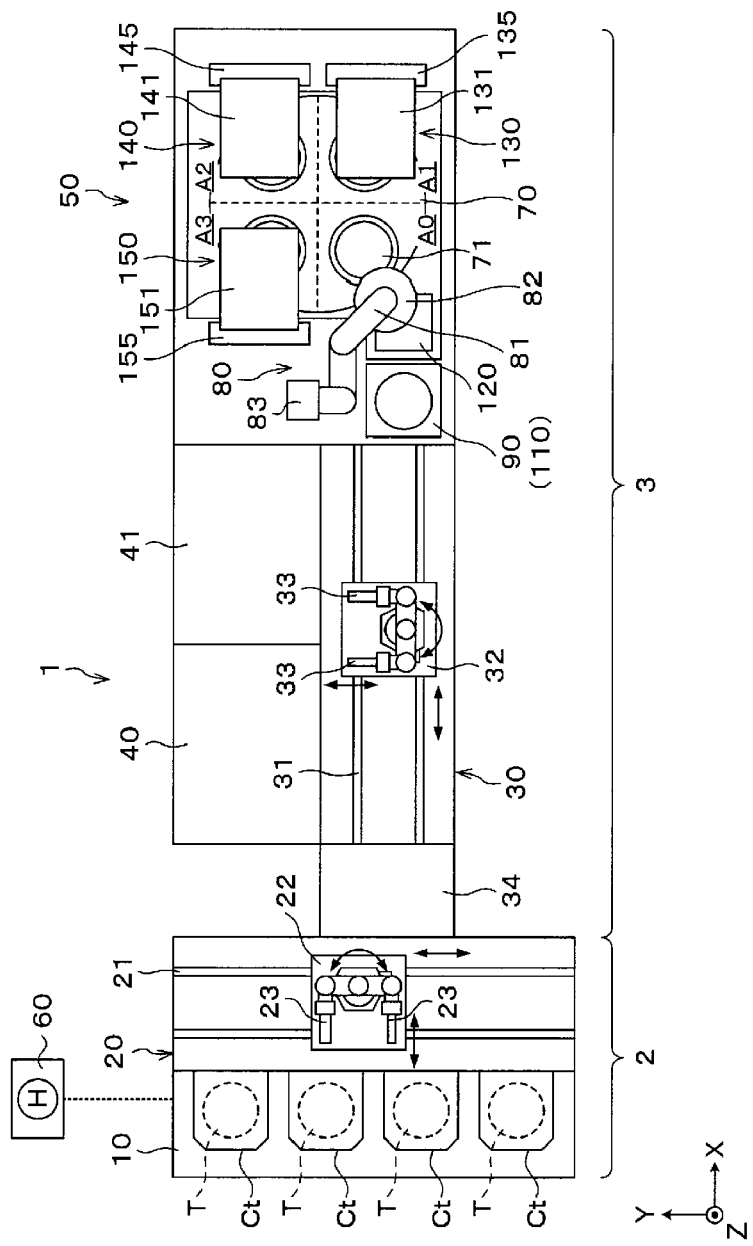
FIG. 1 is a schematic plan view illustrating a configuration of a substrate processing system according to a first exemplary embodiment.

First, the conventional end face grinding device disclosed in Patent Document 1 will be described. The end face grinding device includes a chuck table, a spindle and a diamond wheel. The chuck table is configured to place a wafer thereon and is rotated around a Z-axis direction (vertical direction) as a rotation axis. The spindle is equipped with the diamond wheel at a tip end thereof and is rotated around a Y-axis direction (horizontal direction). Further, the spindle moves in the Y-axis direction and in the Z-axis direction. The diamond wheel is a disk-shaped grinding tool having diamond abrasive grains on an outer peripheral portion thereof. When an end face of a peripheral portion of a wafer is ground by using this end face grinding device, the diamond wheel is brought into contact with the wafer by moving the spindle in the Y-axis direction and in the Z-axis direction while rotating the chuck table. As a result, the peripheral portion of the wafer is ground into a substantially L-shape.

Here, in a manufacturing process for a semiconductor device, a semiconductor wafer having, for example, a plurality of electronic circuits on a front surface thereof is thinned by grinding a rear surface of the wafer. Then, if the thinned wafer is transferred or subjected to a subsequent processing as it is, bending or crack may occur in the wafer. Therefore, in order to reinforce the wafer, for example, bonding of the wafer to a support substrate is performed.

A peripheral portion of a wafer is typically chamfered, and if the wafer is ground as described above, the peripheral portion of the wafer has a sharply pointed shape (so-called "knife edge shape"). In this case, the peripheral portion of the wafer may be chipped and the wafer can be damaged. Therefore, before the grinding processing, trimming of the peripheral portion of the wafer (so-called "edge trimming") is performed.

The above-described end face grinding device disclosed in Patent Document 1 is configured to perform the edge trimming. However, in this end face grinding device, movements of the spindle in the Z-axis direction may not be uniform due to various factors such as tolerance or the like. In this case, movements of the diamond wheel in the Z-axis direction may not be appropriately controlled and thus even a front surface of the support substrate may also be ground. Therefore, the conventional edge trimming still has room for improvement.

Hereinafter, a substrate processing system and a substrate processing method according to the present exemplary embodiment for appropriately performing the edge trimming will be described with reference to the accompanying drawings. Further, in the present specification and drawings, components that have substantially the same function and structure are denoted with the same reference numeral, and repeated explanation is omitted.

First, a configuration of a substrate processing system according to a first exemplary embodiment will be described. FIG. 1 is a schematic plan view illustrating a configuration of a substrate processing system 1 according to the first exemplary embodiment.

Figure 2:
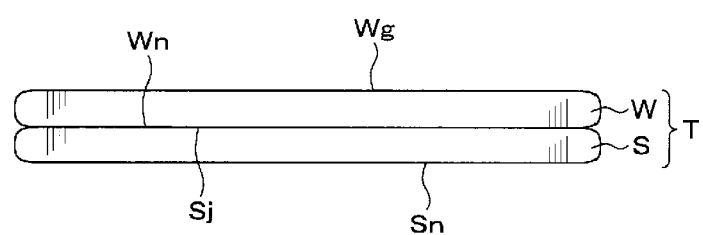
FIG. 2 is a schematic side view illustrating a configuration of a combined wafer.
Figure 3:
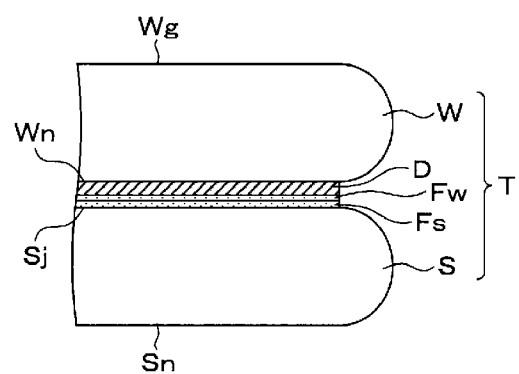
FIG. 3 is a schematic side view illustrating a configuration of a part of the combined wafer.

In the substrate processing system 1, a target wafer W as a first substrate is bonded to a support wafer S as a second substrate to form a combined wafer T as shown in FIG. 2 and FIG. 3 and then the target wafer W is thinned. Hereinafter, as for the target wafer W, a to-be-processed surface (a surface opposite to a surface bonded to the support wafer S) will be referred to as "processing surface Wg" and a surface opposite to the processing surface Wg will be referred to as "non-processing surface Wn". Also, as for the support wafer S, a surface to be bonded to the target wafer W will be referred to as "bonding surface Sj" and a surface opposite to the bonding surface Sj will be referred to as "non-bonding surface Sn".

The target wafer W is a semiconductor wafer such as a silicon wafer and a device layer D including a plurality of devices is formed on the non-processing surface Wn. Also, an oxide film Fw such as an $SiO_2$ film is formed on the device layer D. Further, a peripheral portion of the target wafer W is chamfered so that a cross section of the peripheral portion decreases in thickness toward a leading end thereof.

The support wafer S is configured to support the target wafer W and may be, for example, a silicon wafer. An oxide film Fs such as an $SiO_2$ film is formed on the bonding surface Sj of the support wafer S. Further, the support wafer S functions as a protection member configured to protect the non-processing surface Wn of the target wafer W. Furthermore, if a plurality of devices is formed on the bonding surface Sj of the support wafer S, a device layer (not shown) is formed on the bonding surface Sj as well as on the target wafer W.

FIG. 2 omits the illustration of the device layer D and the oxide films Fw and Fs for simplification of illustration. Also, in the other drawings to be referred to below, the illustration of the device layer D and the oxide films Fw and Fs may be omitted.

As shown in FIG. 1, the substrate processing system 1 includes a carry-in/out station 2 and a processing station 3 which are connected as one body. A cassette Ct configured to accommodate a plurality of combined wafers T is carried in/out between the carry-in/out station 2 and, for example, the outside. The processing station 3 includes various processing devices configured to perform predetermined processings on the combined wafer T.

In the carry-in/out station 2, a cassette mounting table 10 is provided. In the illustrated example, a plurality of, for example, four cassettes Ct can be arranged in a row in the Y-axis direction on the cassette mounting table 10. Further, the number of cassettes Ct arranged on the cassette mounting table 10 is not limited to the present exemplary embodiment, but can be arbitrarily determined.

In the carry-in/out station 2, a wafer transfer section 20 is provided adjacent to the cassette mounting table 10. The wafer transfer section 20 is equipped with a wafer transfer device 22 which is movable along a transfer path 21 elongated in the Y-axis direction. The wafer transfer device 22 is configured to hold and transfer the combined wafer T and has, for example, two transfer arms 23 and 23. Each transfer arm 23 is movable in the horizontal direction, in the vertical direction, around a horizontal axis and around a vertical axis. Also, the configuration of the transfer arm 23 is not limited to the present exemplary embodiment, but can be arbitrarily determined.

In the processing station 3, a wafer transfer section 30 is provided. The wafer transfer section 30 is equipped with a wafer transfer device 32 which is movable along a transfer path 31 elongated in an X-axis direction. The wafer transfer device 32 is configured to transfer the combined wafer T to a transition device 34, wet etching devices 40 and 41 and a processing device 50 which will be described below. Further, the wafer transfer device 32 has, for example, two transfer arms 33 and 33 each configured to hold and transfer the combined wafer T. Each transfer arm 33 is movable in the horizontal direction, in the vertical direction, around the horizontal axis and around the vertical axis. Also, the configuration of the transfer arm 33 is not limited to the present exemplary embodiment, but can be arbitrarily determined.

The transition device 34 for delivering the combined wafer T is provided between the wafer transfer section 20 and the wafer transfer section 30.

On the positive side of the Y-axis direction of the wafer transfer section 30, the wet etching devices 40 and 41 are arranged in this order from the carry-in/out station 2 in the X-axis direction. In the wet etching devices 40 and 41, wet etching is performed on the processing surface Wg of the target wafer W with a chemical solution such as hydrofluoric acid or the like.

On the positive side of the X-axis direction of the wafer transfer section 30, the processing device 50 is placed. In the processing device 50, processings such as grinding and cleaning are performed on the target wafer W.

The substrate processing system 1 described above is equipped with a control device 60. The control device 60 is, for example, a computer, and is provided with a program storage (not shown). The program storage stores a program that controls a processing of the combined wafer T in the substrate processing system 1. Also, the program storage stores a program for controlling operations of a driving unit such as the above-described processing devices and transfer devices to implement a substrate processing, which will be described below, in the substrate processing system 1. Further, the program is recorded in a computer-readable recording medium H and may be installed on the control device 60 from the recording medium H.

Hereinafter, the processing device 50 will be described. The processing device 50 includes a turntable 70, a transfer unit 80, a processing unit 90, a first cleaning unit 110, a second cleaning unit 120, a rough grinding unit 130, an intermediate grinding unit 140 and a finishing grinding unit 150.

The turntable 70 is configured to be rotated by a rotating mechanism (not shown). Four chucks 71 each configured to attract and hold the combined wafer T are provided on the turntable 70. The chucks 71 are equally spaced, i.e., located every 90 degrees, on a circle concentric with the turntable 70. The four chucks 71 can be moved to a delivery position A0 and processing positions A1 to A3 as the turntable 70 is rotated. Also, each of the four chucks 71 is configured to be pivotable around a vertical axis by a rotation mechanism (not shown).

In the present exemplary embodiment, the delivery position A0 refers to a position on the negative side of the X-axis direction and the negative side of the Y-axis direction of the turntable 70, and on the negative side of the X-axis direction of the delivery position A0, the second cleaning unit 120, the processing unit 90 and the first cleaning unit 110 are arranged. The processing unit 90 and the first cleaning unit 110 are stacked in this order from above. The first processing position A1 refers to a position on the positive side of the X-axis direction and the negative side of the Y-axis direction of the turntable 70, and the rough grinding unit 130 is placed at the first processing position A1. The second processing position A2 refers to a position on the positive side of the X-axis direction and the positive side of the Y-axis direction of the turntable 70, and the intermediate grinding unit 140 is placed at the second processing position A2. The third processing position A3 refers to a position on the negative side of the X-axis direction and the positive side of the Y-axis direction of the turntable 70, and the finishing grinding unit 150 is placed at the third processing position A3.

The transfer unit 80 is a multi-joint robot having a plurality of, for example, three arms 81. Each of the three arms 81 is configured to be pivotable. An arm 81 at a leading end is equipped with a transfer pad 82 that attracts and holds the combined wafer T. Also, an arm 81 at a base end is provided in a moving mechanism 83 configured to move the arm 81 in the vertical direction. Further, the transfer unit 80 having the configuration as described above may transfer the combined wafer T to the delivery position A0, the processing unit 90, the first cleaning unit 110 and the second cleaning unit 120.

In the processing unit 90, an orientation of the horizontal direction of the combined wafer T before being ground is adjusted. For example, while the combined wafer T held on a chuck 91 is rotated, a position of a notch of the target wafer W is detected by a detector (not shown) to adjust the position of the notch and thus to adjust the orientation of the horizontal direction of the combined wafer T.

Figure 4:
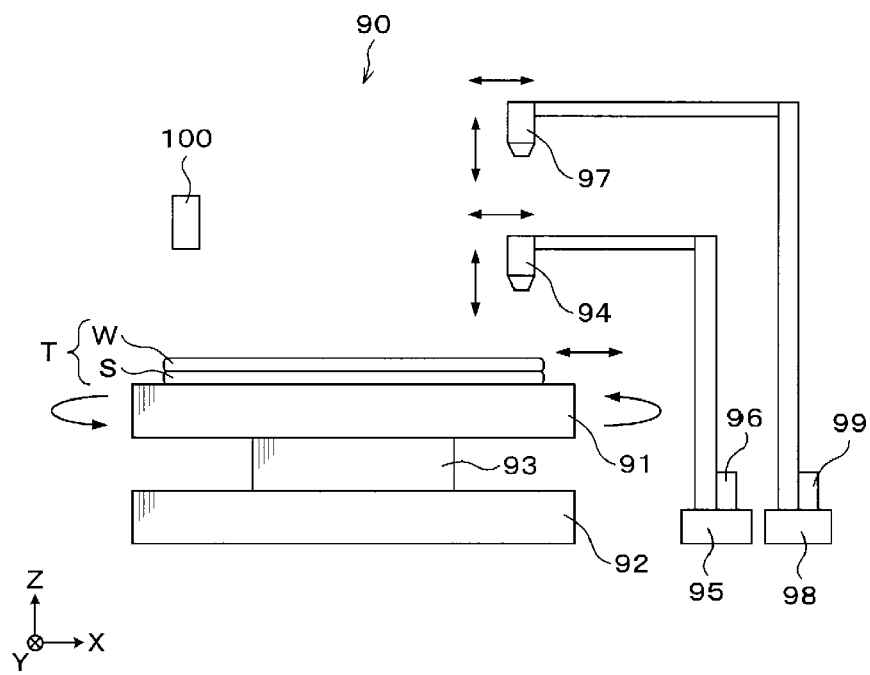
FIG. 4 is a schematic side view illustrating a configuration of a processing unit.

Further, in the processing unit 90, a laser beam is radiated into the target wafer W to form a modification layer. The processing unit 90 is equipped with the chuck 91 that holds the combined wafer T in which the target wafer W is arranged on the upper side and the support wafer S is arranged on the lower side as shown in FIG. 4. The chuck 91 is configured to be movable in the X-axis direction and in the Y-axis direction by a moving mechanism 92. The moving mechanism 92 is configured as a general precise XY stage. Further, the chuck 91 is configured to be pivotable around a vertical axis by a rotation mechanism 93.

A first laser head 94 configured to radiate a laser beam into the target wafer W is provided above the chuck 91. The first laser head 94 focuses a high frequency pulse-shaped laser oscillated from a laser beam oscillator (not shown), i.e., a laser beam having a wavelength transmissive to the target wafer W, to a predetermined position within the target wafer W. Thus, in the target wafer W, a portion where the laser beam is focused is modified. The first laser head 94 is configured to be movable in the X-axis direction and in the Y-axis direction by a moving mechanism 95. The moving mechanism 95 is configured as a general precise XY stage. Further, the first laser head 94 is configured to be movable in the Z-axis direction by an elevation mechanism 96.

Furthermore, in the processing unit 90, a laser beam is radiated into the target wafer W to form a modification surface on a peripheral portion We. Specifically, for example, a laser beam is radiated even to the non-processing surface Wn of the target wafer W to cause ablation on each interface. As a result, bonding force at an interface between the target wafer W and the support wafer S corresponding to the peripheral portion We to be removed as described below is reduced, and, thus, it is possible to efficiently remove the peripheral portion We. In this case, a second laser head 97 configured to radiate a laser beam to the non-processing surface Wn and modify the surface is provided above the chuck 91. The second laser head 97 focuses a high frequency pulse-shaped laser oscillated from a laser beam oscillator (not shown), i.e., a laser beam having a wavelength transmissive to the target wafer W, to a predetermined position within the target wafer W. Thus, in the target wafer W, a portion where the laser beam is focused is modified. The second laser head 97 is configured to be movable in the X-axis direction and in the Y-axis direction by a moving mechanism 98. The moving mechanism 98 is configured as a general precise XY stage. Further, the second laser head 97 is configured to be movable in the Z-axis direction by an elevation mechanism 99.

Furthermore, in the processing unit 90, a position of a modification layer M or an inner periphery position of a modification surface R1 formed in the target wafer W is detected. In this case, a position detector 100 is provided above an outer peripheral portion of the chuck 91. The position detector 100 is configured to be movable in the X-axis direction, in the Y-axis direction and in the Z-axis direction by a moving mechanism (not shown). The position detector 100 may be equipped with, for example, an IR camera using infrared rays. Further, the position detector 100 detects the position of the modification layer M or the inner periphery position of the modification surface R1 formed in the target wafer W in the combined wafer T held on the chuck 91.

In the first cleaning unit 110, the processing surface Wg of the target wafer W after being ground is cleaned and more specifically spin-cleaned as shown in FIG. 1. For example, while the combined wafer T held on a spin chuck (not shown) is rotated, a cleaning solution is supplied onto the processing surface Wg from a cleaning solution nozzle (not shown). Then, the supplied cleaning solution is spread on the processing surface Wg so that the processing surface Wg is cleaned.

In the second cleaning unit 120, the non-bonding surface Sn of the support wafer S is cleaned while the target wafer W after being ground is held on the transfer pad 82, and also the transfer pad 82 is cleaned.

Figure 5:
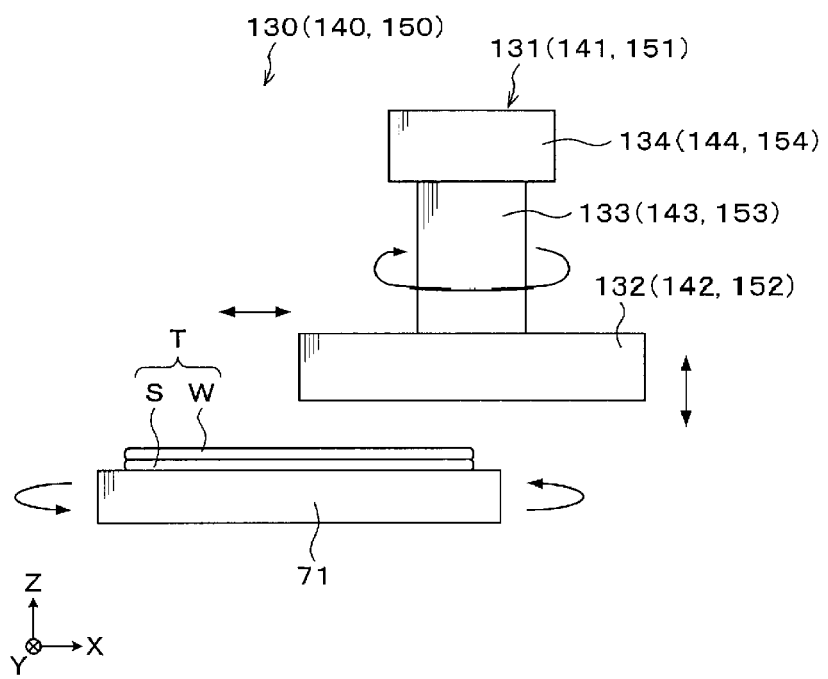
FIG. 5 is a schematic side view illustrating a configuration of each grinding unit.

In the rough grinding unit 130, rough grinding is performed on the processing surface Wg of the target wafer W. The rough grinding unit 130 has a rough grinder 131. The rough grinder 131 is equipped with a rough grinding whetstone 132, a spindle 133 and a driver 134 as shown in FIG. 5. The rough grinding whetstone 132 is annularly provided above the chuck 71. The rough grinding whetstone 132 is equipped with the driver 134 via the spindle 133. The driver 134 includes, for example, a motor (not shown) to rotate the rough grinding whetstone 132 and move the rough grinding whetstone 132 in the vertical direction and the horizontal direction along a column 135 shown in FIG. 1. Further, in the rough grinding unit 130, in a state where the target wafer W held on the chuck 71 is in contact with a part of a circular arc of the rough grinding whetstone 132, each of the chuck 71 and the rough grinding whetstone 132 is rotated to grind the processing surface Wg of the target wafer W.

In the intermediate grinding unit 140, intermediate grinding is performed on the processing surface Wg of the target wafer W. The intermediate grinding unit 140 has substantially the same configuration as the rough grinding unit 130, as shown in FIG. 1 and FIG. 5 and is equipped with an intermediate grinder 141, an intermediate grinding whetstone 142, a spindle 143, a driver 144 and a column 145. Further, a particle size of abrasive grains of the intermediate grinding whetstone 142 is smaller than a particle size of abrasive grains of the rough grinding whetstone 132.

In the finishing grinding unit 150, finishing grinding is performed on the processing surface Wg of the target wafer W. The finishing grinding unit 150 has substantially the same configuration as the intermediate grinding unit 140, as shown in FIG. 1 and FIG. 5 and is equipped with a finishing grinder 151, a finishing grinding whetstone 152, a spindle 153, a driver 154 and a column 155. Further, a particle size of abrasive grains of the finishing grinding whetstone 152 is smaller than the particle size of abrasive grains of the intermediate grinding whetstone 142.

Further, in the present exemplary embodiment, the processing unit 90 has the first laser head 94 serving as a modifying unit, and the processing device 50 is configured as a modification layer forming device. Furthermore, in the present exemplary embodiment, the processing unit 90 has the second laser head 97 serving as an interface processing unit, and the processing device 50 is configured as an interface processing device. Also, in the present exemplary embodiment, the processing unit 90 has the position detector 100, and the processing device 50 is configured as a position detection device. Moreover, in the present exemplary embodiment, as described below, the peripheral portion We of the target wafer W is removed by the rough grinding unit 130 (or the rough grinding unit 130 and the intermediate grinding unit 140), and the processing device 50 is configured as a periphery removing device.

Hereinafter, a processing performed in the processing unit 90 shown in FIG. 4 will be described. In the processing unit 90, the following three processings are performed in addition to the adjusting of the orientation of the horizontal direction of the combined wafer T by the detector (not shown). A first processing is a processing of forming the modification layer with the first laser head 94. A second processing is a processing of forming the modification surface with the second laser head 97. A third processing is a processing of detecting the modification layer or the modification surface with the position detector 100. Out of these, the third processing of detecting the modification layer or the modification surface controls the first laser head 94 in the first processing and the second laser head 97 in the second processing as described below.

Figure 6:
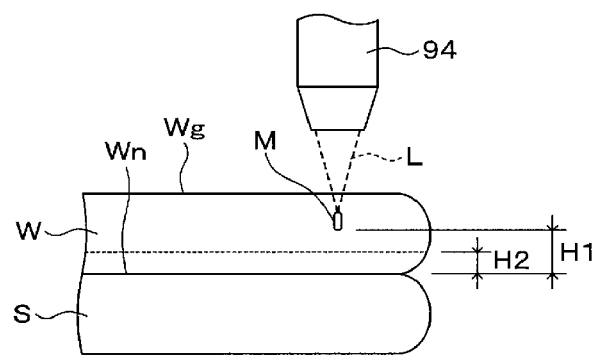
FIG. 6 is a longitudinal cross sectional view illustrating a modification layer formed in a target wafer.
Figure 7:
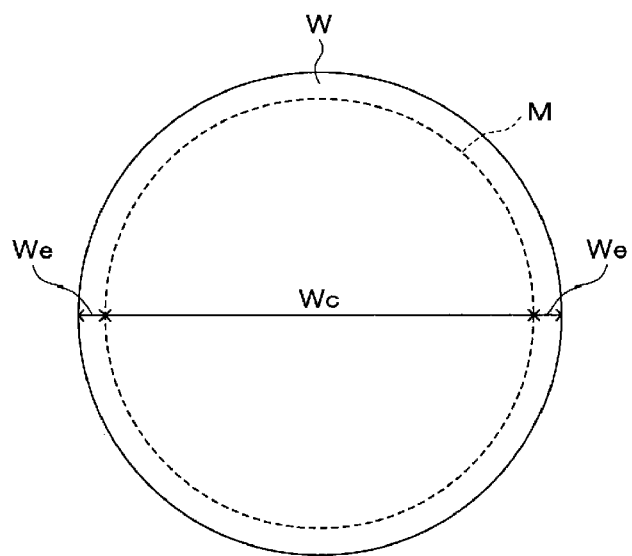
FIG. 7 is a plan view illustrating the modification layer formed in the target wafer.

The forming of the modification layer with the first laser head 94 as the first processing performed in the processing unit 90 will be described. In the processing unit 90, while the chuck 91 is rotated by the rotation mechanism 93, the laser beam is radiated into the target wafer W from the first laser head 94. Then, in the target wafer W, a portion where the laser beam L is focused is modified to form the modification layer M as shown in FIG. 6. The modification layer M is elongated in a plate thickness direction and has a vertically long aspect ratio. Also, the modification layer M is annularly formed as shown in FIG. 7.

The position of the modification layer M formed in the target wafer W will be described in detail. In the substrate processing system 1, the processing surface Wg of the target wafer W bonded to the support wafer S is ground, and the peripheral portion of the target wafer W is removed before being ground, in order to suppress the knife edge from being formed on the peripheral portion of the target wafer W after being ground. The modification layer M serves as a starting point of removing the peripheral portion and is annularly formed along a boundary between a central portion Wc and the peripheral portion We as a removing target in the target wafer W as shown in FIG. 7. Also, the peripheral portion We is in the range of, for example, 0.5 mm to 2.0 mm in a diametric direction from an edge of the target wafer W and includes the chamfered portion.

Further, as shown in FIG. 6, a lower end of the modification layer M is located above a target surface (indicated by a dotted line in FIG. 6) of the target wafer W after being ground. That is, a distance H1 between the lower end of the modification layer M and the non-processing surface Wn of the target wafer W is greater than a target thickness H2 of the target wafer W after being ground. The distance H1 is arbitrary and may be, for example, 5 μm to 10 μm greater than the target thickness H2. In this case, the modification layer M does not remain in the target wafer W after being ground.

Further, in the processing unit 90 according to the present exemplary embodiment, the chuck 91 is moved in the horizontal direction, but the first laser head 94 may be moved in the horizontal direction, or both the chuck 91 and the first laser head 94 may be moved in the horizontal direction. Furthermore, the chuck 91 is rotated, but the first laser head 94 may be rotated.

The forming of the modification surface with the second laser head 97 as the second processing performed in the processing unit 90 will be described. In the processing unit 90, when the interface between the target wafer W and the support wafer S is processed, the inside of the target wafer W is modified or the inside of the device layer D is modified. That is, in the present exemplary embodiment, the interface includes the inside of the target wafer W and the inside of the device layer D.

Figure 8:
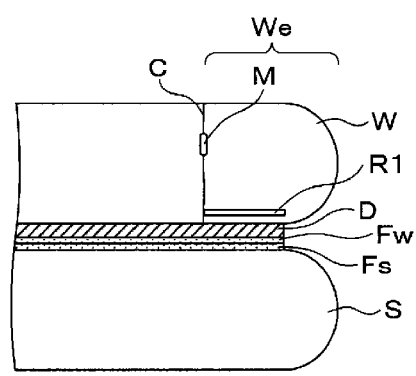
FIG. 8 is a longitudinal cross sectional view illustrating a modification surface formed in the target wafer.
Figure 9:
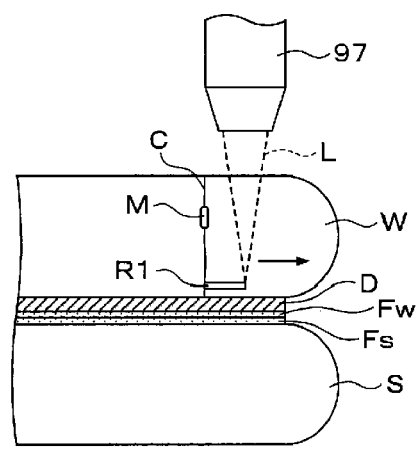
FIG. 9 is an explanatory diagram for the longitudinal cross sectional view showing an operation where the modification surface shown in FIG. 8 is being formed.

As shown in FIG. 8, if the inside of the target wafer W is modified, a modification surface R1 is formed near the non-processing surface Wn in the peripheral portion We (outside the modification layer M). In this processing method, a laser beam L is radiated from the second laser head 97 toward the inside of the target wafer W as shown in FIG. 9. The laser beam L is focused passing through the inside of the target wafer W and a portion where the laser beam L is focused is modified. Then, while the chuck 91 is rotated by the rotation mechanism 93, the second laser head 97 is moved outwards in a diametric direction by the moving mechanism 98 and the laser beam L is radiated into the target wafer W from the second laser head 97. As a result, the modification surface R1 is formed. Otherwise, when the modification surface R1 is formed, the chuck 91 may be moved in the diametric direction by the moving mechanism 92, or both the second laser head 97 and the chuck 91 may be moved.

Further, if the modification surface R1 is formed within the target wafer W as such, after the peripheral portion We is removed, a part of the target wafer W remains on the support wafer S. For this reason, after the peripheral portion We is removed, the remaining part of the target wafer W may be removed by etching.

Figure 10:
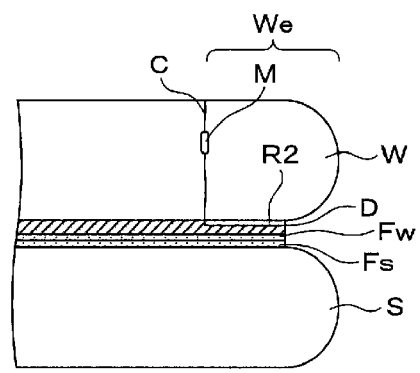
FIG. 10 is a longitudinal cross sectional view illustrating the modification surface formed on a device layer of the processing wafer.

As shown in FIG. 10, if the inside of the device layer D is modified, a modification surface R2 is formed within the device layer D in the peripheral portion We (outside the modification layer M). This processing method may include, for example, three methods as shown in FIG. 11A to FIG. 11C.

Figure 11A:
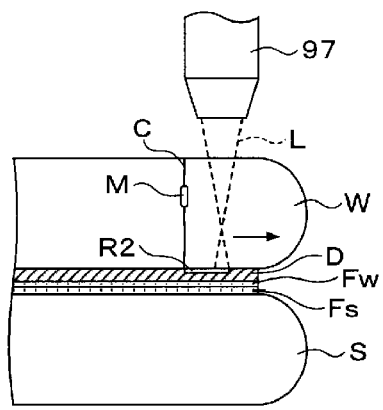
FIG. 11A to FIG. 11C are explanatory diagrams for the longitudinal cross sectional view showing an operation where the modification surface shown in FIG. 10 is being formed.

A first processing method is a method of locating a focusing point of the laser beam L from the second laser head 97 above the device layer D within the target wafer W as shown in FIG. 11A. In this case, energy of the laser beam L is set to be small enough for the target wafer W not to be modified even when the laser beam L is focused. Then, the laser beam L is focused first within the target wafer W and the laser beam L which is defocused and spread passes through the target wafer W to be radiated to the device layer D. The laser beam L is absorbed into the device layer D, and the device layer D causes ablation. Further, while the chuck 91 is rotated by the rotation mechanism 93, the second laser head 97 is moved outwards in the diametric direction by the moving mechanism 98 and the laser beam L is radiated from the second laser head 97. As a result, the modification surface R2 is formed. Otherwise, when the modification surface R2 is formed, the chuck 91 may be moved in the diametric direction by the moving mechanism 92, or both the second laser head 97 and the chuck 91 may be moved.

Figure 11B:
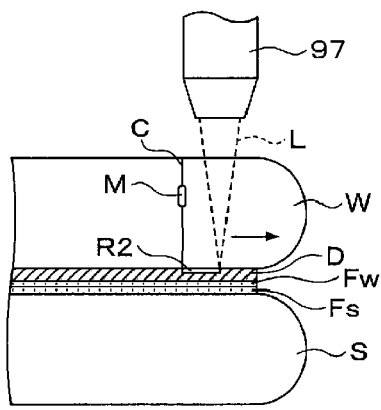

A second processing method is a method of locating the focusing point of the laser beam L from the second laser head 97 within the device layer D as shown in FIG. 11B. In this case, the laser beam L passes through the target wafer W to be radiated to the device layer D, and the device layer D causes the ablation. Further, while the chuck 91 is rotated by the rotation mechanism 93, the second laser head 97 is moved outwards in the diametric direction by the moving mechanism 98 and the laser beam L is radiated from the second laser head 97. As a result, the modification surface R2 is formed. Otherwise, when the modification surface R2 is formed, the chuck 91 may be moved in the diametric direction by the moving mechanism 92, or both the second laser head 97 and the chuck 91 may be moved.

Figure 11C:
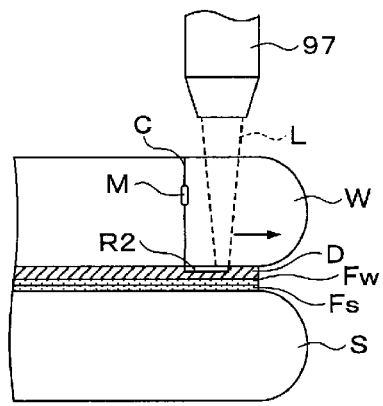

A third processing method is a method of locating the focusing point of the laser beam L from the second laser head 97 below the device layer D as shown in FIG. 11C. In this case, the laser beam L passes through the target wafer W to be radiated to the device layer D, and the device layer D causes the ablation. Also, the laser beam L is absorbed in the device layer D and thus is not focused below the device layer D. Further, while the chuck 91 is rotated by the rotation mechanism 93, the second laser head 97 is moved outwards in the diametric direction by the moving mechanism 98 and the laser beam L is irradiated from the second laser head 97. Then, the modification surface R2 is formed in the device layer D. Otherwise, when the modification surface R2 is formed, the chuck 91 may be moved in the diametric direction by the moving mechanism 92, or both the second laser head 97 and the chuck 91 may be moved.

The detecting of the modification layer M or the modification surfaces R1 and R2 with the position detector 100 as the third processing performed in the processing unit 90 will be described. This processing is performed to match the position of the modification layer M with the inner periphery position of the modification surface R1 or R2.

Figure 12:
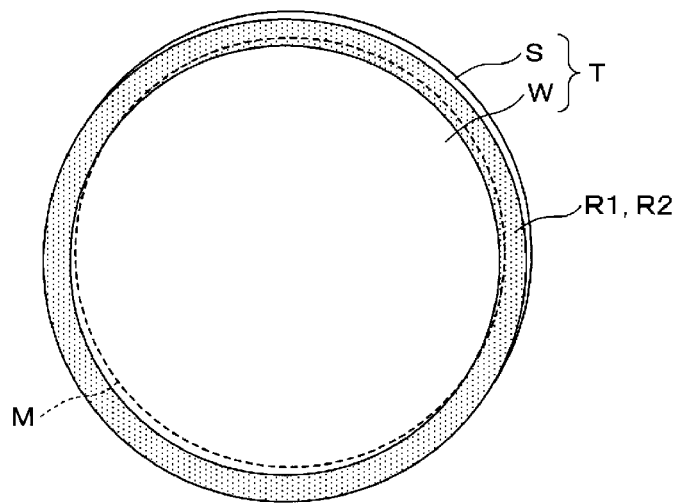
FIG. 12 is a plan view illustrating that the target wafer of the combined wafer is eccentric.

The reason for matching the position of the modification layer M with the inner periphery position of the modification surface R1 or R2 will be described. For example, FIG. 12 illustrates the combined wafer T in which the target wafer W is eccentrically bonded and the position of the modification layer M is not matched with the inner periphery position of the modification surface R1 or R2. In this case, as shown in FIG. 12, a part of the modification layer M is located more inwards in the diametric direction than the inner periphery of the modification surface R1 or R2 and a part of the modification layer M is located more outwards in the diametric direction than the inner periphery of the modification surface R1 or R2.

Figure 13A:
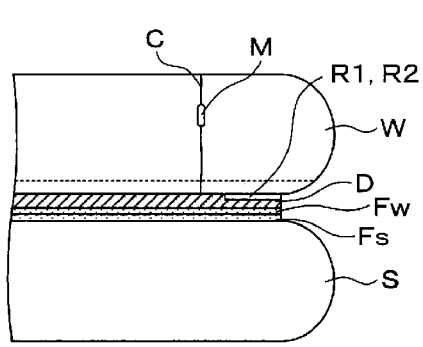
FIG. 13A and FIG. 13B are explanatory diagrams showing that the modification layer is located more inwards in a diametric direction than an inner periphery of the modification surface.
Figure 13B:
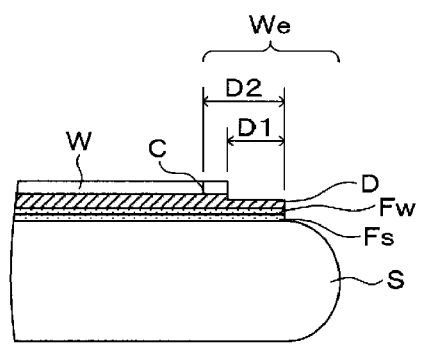

If the modification layer M is located more inwards in the diametric direction than the inner periphery of the modification surface R1 or R2 as shown in FIG. 13A, when the peripheral portion We is removed by grinding the processing surface Wg as shown in FIG. 13B, a width D1 of the removed peripheral portion is smaller than a target width D2 of the peripheral portion We to be removed. Also, the removed peripheral portion is peeled off not through the modification layer M and a crack C, so that an outer surface of the target wafer W may be rough after the peripheral portion is removed.

Figure 14A:
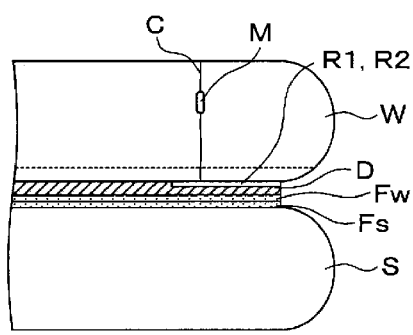
FIG. 14A and FIG. 14B are explanatory diagrams showing that the modification layer is located more outwards in the diametric direction than the inner periphery of the modification surface.
Figure 14B:
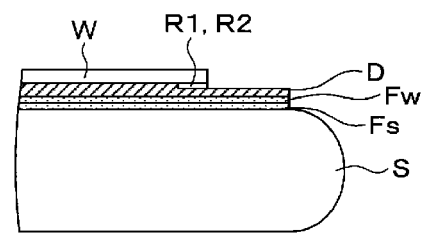

If the modification layer M is located more outwards in the diametric direction than the inner periphery of the modification surface R1 or R2 as shown in FIG. 14A, when the peripheral portion We is removed by grinding the processing surface Wg of the target wafer W as shown in FIG. 14B, the modification surface R1 or R2 remains between the target wafer W and the device layer D. In a portion where the modification surface R1 or R2 remains, the target wafer W may be peeled off from the device layer D, which may cause the chipping.

In the present exemplary embodiment, to solve a mismatch between the position of the modification layer M and the inner periphery position of the modification surface R1 or R2, the position of the modification layer M or the inner periphery position of the modification surface R1 or R2 is detected with the position detector 100. Further, the position of the modification surface R1 or R2 or the modification layer M to be formed in a subsequent processing is adjusted based on the result of the detection.

Hereinafter, wafer processings to be performed by the substrate processing system 1 configured as described above will be described. In the present exemplary embodiment, the combined wafer T is formed in advance by bonding the target wafer W and the support wafer S by van der Waals forces and hydrogen bond (intermolecular force) in a bonding device (not shown) outside the substrate processing system 1.

First, the cassette Ct that accommodates a plurality of combined wafers T is placed on the cassette mounting table 10 of the carry-in/out station 2.

Then, a combined wafer T is taken out of the cassette Ct and transferred into the transition device 34 by the wafer transfer device 22. Thereafter, the combined wafer T is taken out of the transition device 34 and transferred into the processing device 50 by the wafer transfer device 32.

The combined wafer T transferred into the processing device 50 is delivered to the processing unit 90. In the processing unit 90, the combined wafer T is delivered onto the chuck 91 by the wafer transfer device 32 and held on the chuck 91. Then, the orientation of the horizontal direction of the target wafer W is adjusted by the detector (not shown).

Figure 15A:
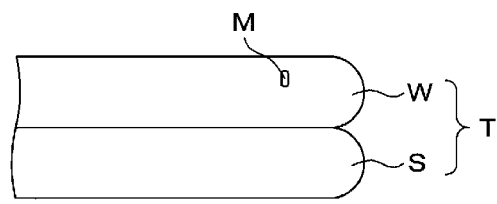
FIG. 15A to FIG. 15D are explanatory diagrams showing the target wafer in main processes of a wafer processing according to the first exemplary embodiment.

Also, in the processing unit 90, the chuck 91 is moved in the horizontal direction by the moving mechanism 92 to perform centering of the combined wafer T, and the position of the first laser head 94 is adjusted to be located right above a predetermined position of the combined wafer T (the target wafer W). The predetermined position refers to the boundary between the peripheral portion We and the central portion Wc of the target wafer W. Then, while the chuck 91 is rotated by the rotation mechanism 93, the laser beam L is radiated into the target wafer W from the first laser head 94 to form the annular modification layer M within the target wafer W as shown in FIG. 15A. Also, the position of the target wafer W is as described above with reference to FIG. 6 and FIG. 7.

If the modification layer M is formed in the target wafer W, the modification layer M within the target wafer W is imaged by the position detector 100 with infrared rays to detect the position of the modification layer M. The detection result by the position detector 100 is output to the control device 60. In the control device 60, a central axis of the chuck 91 or an irradiation axis of the laser beam L from the second laser head 97 is adjusted based on the detection result by the position detector 100, i.e., based on the position of the modification layer M.

Figure 15B:
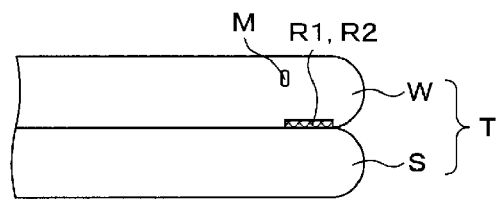

Then, the first laser head 94 is retreated, and the second laser head 97 is moved to above the peripheral portion We under the control of the control device 60. Thereafter, while the chuck 91 is rotated, the second laser head 97 is moved outwards in the diametric direction and the laser beam is radiated from the second laser head 97. Thus, as shown in FIG. 15B, the modification surface R1 or R2 is formed within the target wafer W or in the device layer D, respectively. In this case, as described above, the central axis of the chuck 91 or the irradiation axis of the laser beam L from the second laser head 97 is already adjusted, and, thus, the modification surface R1 or R2 can be appropriately formed in the target wafer W. As a result, the position of the modification layer M can be matched with the inner periphery position of the modification surface R1 or R2.

Further, the forming of the modification layer M shown in FIG. 15A and the forming of the modification surface R1 or R2 shown in FIG. 15B may be performed in reverse order. In this case, the modification surface R1 or R2 is formed in the target wafer W and then, the modification surface R1 or R2 is imaged by the position detector 100 with infrared rays to detect the inner periphery position of the modification surface R1 or R2. The detection result by the position detector 100 is output to the control device 60.

In the control device 60, the central axis of the chuck 91 or the irradiation axis of the laser beam L from the first laser head 94 is adjusted based on the detection result by the position detector 100, i.e., based on the inner periphery position of the modification surface R1 or R2. Thus, the modification layer M can be appropriately formed in the target wafer W. As a result, the position of the modification layer M can be matched with the inner periphery position of the modification surface R1 or R2.

Figure 15C:
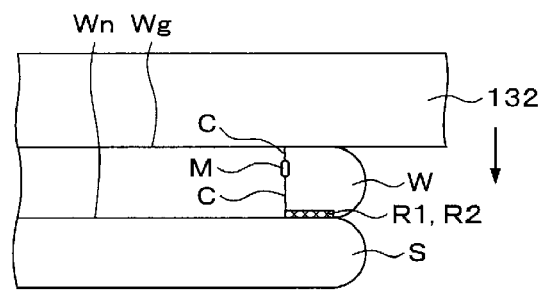

Then, the combined wafer T is transferred from the processing unit 90 to the delivery position A0 and then delivered onto the chuck 71 at the delivery position A0 by the transfer unit 80. Thereafter, the chuck 71 is moved to the first processing position A1. Subsequently, the rough grinding is performed on the processing surface Wg of the target wafer W by the rough grinding unit 130 as shown in FIG. 15C. Specifically, in a state where the target wafer W is in contact with a part of a circular arc of the rough grinding whetstone 132, the rough grinding whetstone 132 is lowered and each of the chuck 71 and the rough grinding whetstone 132 is rotated to grind the processing surface Wg of the target wafer W.

When the processing surface Wg is ground, the crack C within the target wafer W extends from the modification layer M in the plate thickness direction and reaches the processing surface Wg and the non-processing surface Wn. The crack C extends approximately linearly since the target wafer W is formed of single crystalline silicon. Also, the crack C is annularly formed when viewed from the top. The crack C may also extend when the modification layer M is formed by the processing unit 90. In other words, the crack C may be generated when the processing surface Wg is ground by the rough grinding unit 130 or when the modification layer M is formed by the processing unit 90.

Figure 15D:
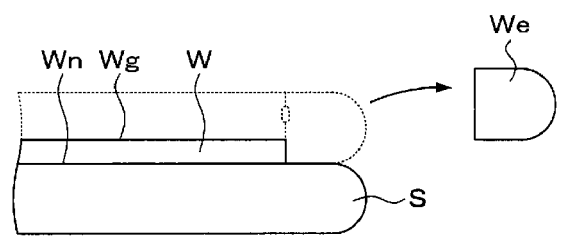

Further, as the grinding of the processing surface Wg progresses, the peripheral portion We of the target wafer W is peeled off and removed starting from the modification layer M and the crack C as shown in FIG. 15D. Here, the crack C extends approximately linearly as described above, and, thus, the outer surface of the target wafer W after being removed can be smooth with less irregularities. Also, the lower end of the modification layer M is located above the target surface of the target wafer W after being ground as described above, and, thus, the modification layer M is removed when the processing surface Wg is ground. The modification layer M is amorphous and thus has low strength. Accordingly, in the present exemplary embodiment, the modification layer M does not remain in the target wafer W after being ground, and, thus, high strength can be secured. Further, since the modification surface R1 or R2 is formed on the interface between the target wafer W and the support wafer S, the bonding force is reduced. Therefore, the peripheral portion We can be appropriately removed.

Then, the chuck 71 is moved to the second processing position A2. Thereafter, the intermediate grinding is performed on the processing surface Wg of the target wafer W by the intermediate grinding unit 140. Further, if the peripheral portion We cannot be completely removed by the rough grinding unit 130, the peripheral portion We is completely removed by the intermediate grinding unit 140. That is, the peripheral portion We may be removed in two stages by the rough grinding unit 130 and the intermediate grinding unit 140. In this case, the size of the peripheral portion We to be removed may decrease in stages. That is, the size of the peripheral portion We to be removed by each of the grinding units 130 and 140 decreases.

Thereafter, the chuck 71 is moved to the third processing position A3. Then, the finishing grinding is performed on the processing surface Wg of the target wafer W by the finishing grinding unit 150.

Subsequently, the chuck 71 is moved to the delivery position A0. Here, the processing surface Wg of the target wafer W is roughly cleaned with the cleaning solution through the cleaning solution nozzle (not shown). Here, the processing surface Wg is cleaned to remove contaminants to some extent.

Then, the combined wafer T is transferred by the transfer unit 80 from the delivery position A0 to the second cleaning unit 120. Thereafter, in the second cleaning unit 120, while the target wafer W is held on the transfer pad 82, the non-bonding surface Sn of the support wafer S is cleaned and dried.

Thereafter, the combined wafer T is transferred by the transfer unit 80 from the second cleaning unit 120 to the first cleaning unit 110. Then, in the first cleaning unit 110, the processing surface Wg of the target wafer W is finally cleaned with the cleaning solution through the cleaning solution nozzle (not shown). Here, the processing surface Wg is cleaned to a required degree of cleanness and dried.

Then, the combined wafer T is sequentially transferred by the wafer transfer device 32 to the wet etching devices 40 and 41, and the processing surface Wg is wet-etched in two stages.

Subsequently, the combined wafer T after being subjected to all the required processings is transferred back into the transition device 34 by the wafer transfer device 32, and then, transferred into the cassette Ct on the cassette mounting table 10 by the wafer transfer device 22. Thus, a series of wafer processings in the substrate processing system 1 is ended.

According to the above-described exemplary embodiment, the following effects can be obtained. The following description is provided by comparison with the conventional method to grind and remove the peripheral portion of the target wafer by the wheel (grinding tool). Also, conventionally, there has been a method to remove the peripheral portion of the target wafer with a blade (grinding tool). This method has the same problem as in the method with the wheel.

If the target wafer and the support wafer are bonded to each other and then, the peripheral portion of the target wafer is ground and removed by the wheel as described in Patent Document 1, the vertical movements of the wheel may not be appropriately controlled due to various factors such as tolerance or the like, which may cause grinding of even the support wafer.

In this regard, in the present exemplary embodiment, the modification layer M is formed within the target wafer W, and, thus, the peripheral portion We can be removed starting from the modification layer M and the crack C. In this case, the bonding surface Sj of the support wafer S is not damaged by the grinding or the like.

Before the target wafer and the support wafer are bonded to each other, if the peripheral portion of the target wafer is ground and removed with the wheel as in the conventional method, particles are generated by the grinding and may be bonded to devices of the target wafer.

In this regard, in the present exemplary embodiment, the peripheral portion We is peeled off and removed starting from the modification layer M and crack C formed within the target wafer W, and, thus, particles are not generated.

If the wheel is used as in the conventional method, there is a limitation in adjusting the position of the wheel in the horizontal direction, which results in a non-uniformity of several μm. Thus, the non-uniformity causes a non-uniformity in width (trim width) of the peripheral portion to be ground and removed by the wheel, and, thus, processing accuracy deteriorates.

In this regard, in the present exemplary embodiment, the modification layer M is formed within the target wafer W with the laser beam, and, thus, high accuracy with an error of, for example, less than 1 μm can be secured. For this reason, the accuracy in width (trim width) of the peripheral portion We to be removed starting from the modification layer M can be improved.

If the wheel is used as in the conventional method, the wheel is lowered to grind the peripheral portion. Therefore, there is a limitation in the rotation speed of the chuck that holds the target wafer, and, thus, it takes time to remove the peripheral portion.

In this regard, in the present exemplary embodiment, the modification layer M is formed within the target wafer W with the high frequency laser beam. Therefore, the rotation speed of the chuck 91 can be increased, and, thus, the processings can be performed in a very short time. Accordingly, the throughput of the wafer processing can be improved.

If the wheel is used as in the conventional method, the wheel is worn away and thus needs to be regularly replaced. Also, when the grinding is performed using the wheel, grinding water is used, and, thus, waste water thereof needs to be treated. For this reason, running cost is required.

In this regard, in the present exemplary embodiment, the first laser head 94 is not degraded with time, and, thus, the cycle of the maintenance can be reduced. Also, the processings are performed as dry processes with the laser beam, and, thus, the grinding water and the waste water do not need to be treated. For this reason, the running cost can be reduced.

Further, the notch for indicating the direction of crystal orientation is formed in the target wafer W which is the semiconductor wafer. However, when the peripheral portion We is removed with the blade only as in the conventional method, it is difficult to leave the shape of the notch as it is.

In this regard, in the present exemplary embodiment, for example, the processing unit 90 can control the operation of the target wafer W relative to the laser beam, and, thus, the modification layer M can be formed corresponding to the shape of the notch. Therefore, the peripheral portion We can be easily removed while leaving the shape of the notch.

Furthermore, in the present exemplary embodiment, the modification surface R1 or R2 is formed on the interface between the target wafer W and the support wafer S by the second laser head 97. Thus, the bonding force at the interface corresponding to the peripheral portion We to be removed is reduced, and, thus, it is possible to efficiently remove the peripheral portion We.

Moreover, according to the present exemplary embodiment, in the processing unit 90, the position detector 100 detects the position of the modification layer M formed in the target wafer W. Also, the central axis of the chuck 91 or the irradiation axis of the laser beam L from the second laser head 97 is adjusted based on the detection result. Then, the modification surface R1 or R2 can thus be appropriately formed in the target wafer W with the second laser head 97. As a result, the position of the modification layer M can be matched with the inner periphery position of the modification surface R1 or R2.

Further, as described above, even if the modification surface R1 or R2 is formed first, the modification layer M can be appropriately formed in the target wafer W with the first laser head 94 in the same manner. The point is that even if any one of the modification layer M or the modification surface R1 or R2 is formed first, the position detector 100 can detect the position of the modification layer M or the inner periphery position of the modification surface R1 or R2 and then, the modification surface R1 or R2 or the modification layer M can thus be appropriately formed. Also, the position of the modification layer M can be matched with the inner periphery position of the modification surface R1 or R2.

Besides, in the processing unit 90, the modification layer M and the modification surface R1 or R2 are formed using the same chuck 91, the target wafer W is not eccentric in the processing by the first laser head 94 and the processing by the second laser head 97. As a result, the position of the modification layer M can be matched with the inner periphery position of the modification surface R1 or R2, and, thus, the peripheral portion We can be more appropriately removed.

Further, in the above-described exemplary embodiment, a method of efficiently removing the peripheral portion We when the processing surface Wg is ground is as follows. For example, the rough grinding whetstone 132 may be rotated, for example, in a direction from the outside of the target wafer W to the inside of the target wafer W being rotated. Otherwise, the rough grinding whetstone 132 may be rotated, for example, in a direction from the inside of the target wafer W to the outside of the target wafer W being rotated. As such, the rotation direction of the rough grinding whetstone 132 may be changed depending on the type of the target wafer W or processing.

Furthermore, when the processing surface Wg is ground, high pressure water may be jetted to the peripheral portion We from the inside toward the outside of the target wafer W to efficiently remove (blow away) the peripheral portion We.

Moreover, in the above-described exemplary embodiment, to solve the mismatch between the position of the modification layer M and the inner periphery position of the modification surface R1 or R2, the detection result of the position of the modification layer M or the inner periphery position of the modification surface R1 or R2 is used. However, it can be solved by other methods. For example, the eccentricity of the target wafer W in the combined wafer T may be detected, and the position of the modification layer M or the inner periphery position of the modification surface R1 or R2 may be adjusted based on the detection result.

Figure 16:
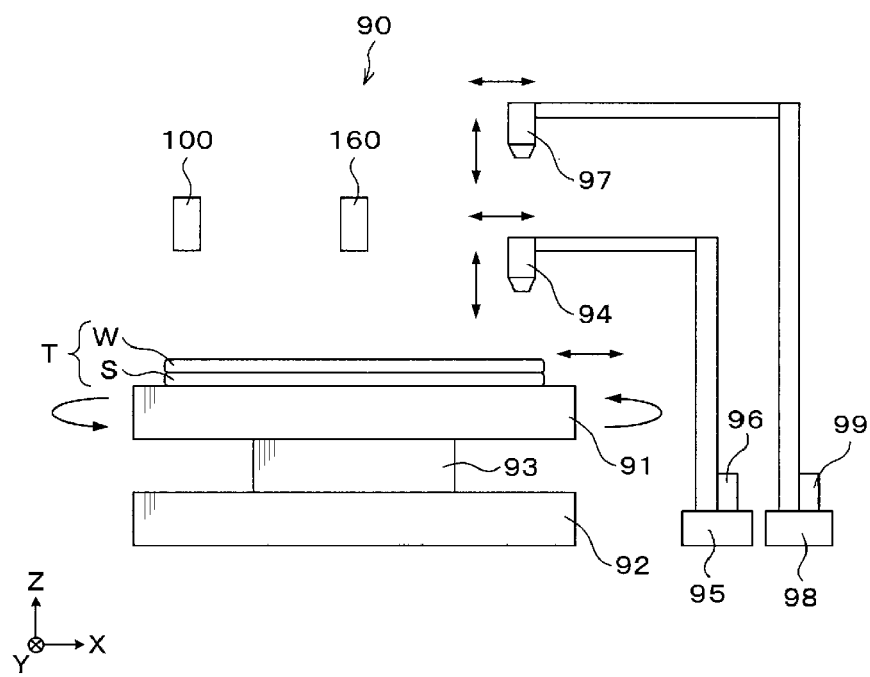
FIG. 16 is a schematic side view illustrating the configuration of the processing unit.

In this case, as shown in FIG. 16, the processing unit 90 is further provided with an eccentricity detector 160 above the central portion of the chuck 91. The eccentricity detector 160 is configured to be movable in the X-axis direction, in the Y-axis direction and in the Z-axis direction by a moving mechanism (not shown). The eccentricity detector 160 is equipped with, for example, a CCD camera. Further, the eccentricity detector 160 captures the image of the combined wafer T held on the chuck 91, for example, at least three points on an outer peripheral portion. Then, a deviation of the center of the target wafer W with respect to the rotation center of the chuck 91, i.e., the eccentricity of the target wafer W in the combined wafer T is detected. Further, the configuration of the eccentricity detector 160 is not limited to the present exemplary embodiment, and the eccentricity detector 160 may further include, for example, an IR camera. In this case, the eccentricity detector 160 captures the image of, for example, an alignment mark formed on the target wafer W and detects the eccentricity of the target wafer W in the combined wafer T.

In the processing unit 90, the combined wafer T is held on the chuck 91 and then, the eccentricity detector 160 captures the image of the combined wafer T to detect the eccentricity of the target wafer W in the combined wafer T. The detection result by the eccentricity detector 160 is output to the control device 60.

In the control device 60, the central axis of the chuck 91, the irradiation axis of the laser beam from the first laser head 94 or the irradiation axis of the laser beam from the second laser head 97 is adjusted based on the detection result by the eccentricity detector 160, i.e., the eccentricity of the target wafer W. By adjusting the central axis of the chuck 91 or the irradiation axis of the first laser head 94, the modification layer M can be appropriately formed in the target wafer W as shown in FIG. 15A. Also, by adjusting the central axis of the chuck 91 or the irradiation axis of the second laser head 97, the modification surface R1 or R2 can be appropriately formed in the target wafer W as shown in FIG. 15B.

As described above, by adjusting the central axis of the chuck 91, the irradiation axis of the first laser head 94 or the irradiation axis of the second laser head 97 based on the detection result by the eccentricity detector 160, the position of the modification layer M can be matched with the inner periphery position of the modification surface R1 or R2.

The eccentricity detector 160 may be provided in an eccentricity detection device (not shown) outside the processing device 50. In this case, when the combined wafer T is transferred from the eccentricity detection device into the processing unit 90 of the processing device 50 by the wafer transfer device 32, the combined wafer T is transferred to match the center of the target wafer W with the center of the chuck 91 based on the detection result by the eccentricity detector 160. Thus, the modification layer M can be appropriately formed in the target wafer W as shown in FIG. 15A and the modification surface R1 or R2 can be appropriately formed within the target wafer W or in the device layer as shown in FIG. 15B. Therefore, the position of the modification layer M can be matched with the inner periphery position of the modification surface R1 or R2.

In the above-described exemplary embodiment, there has been described a case where a single sheet of the target wafer W is bonded in the support wafer S, semiconductor wafers on which devices are formed may be bonded to each other or a plurality of target wafers W on which devices are formed may be stacked. Hereinafter, there will be described a case where a plurality of target wafers W on which devices are formed is stacked by the substrate processing system 1 according to the first exemplary embodiment.

In the following description, a first sheet of a target wafer W stacked on the support wafer S will be referred to as "first target wafer W1" and a second sheet of a target wafer W stacked on the first target wafer W1 will be referred to as "second target wafer W2". Also, in the following description, there will be described a case where the peripheral portion We to be removed from the second target wafer W2 as an upper layer is located within the peripheral portion We to be removed from the first target wafer W1 as a lower layer.

Figure 17:
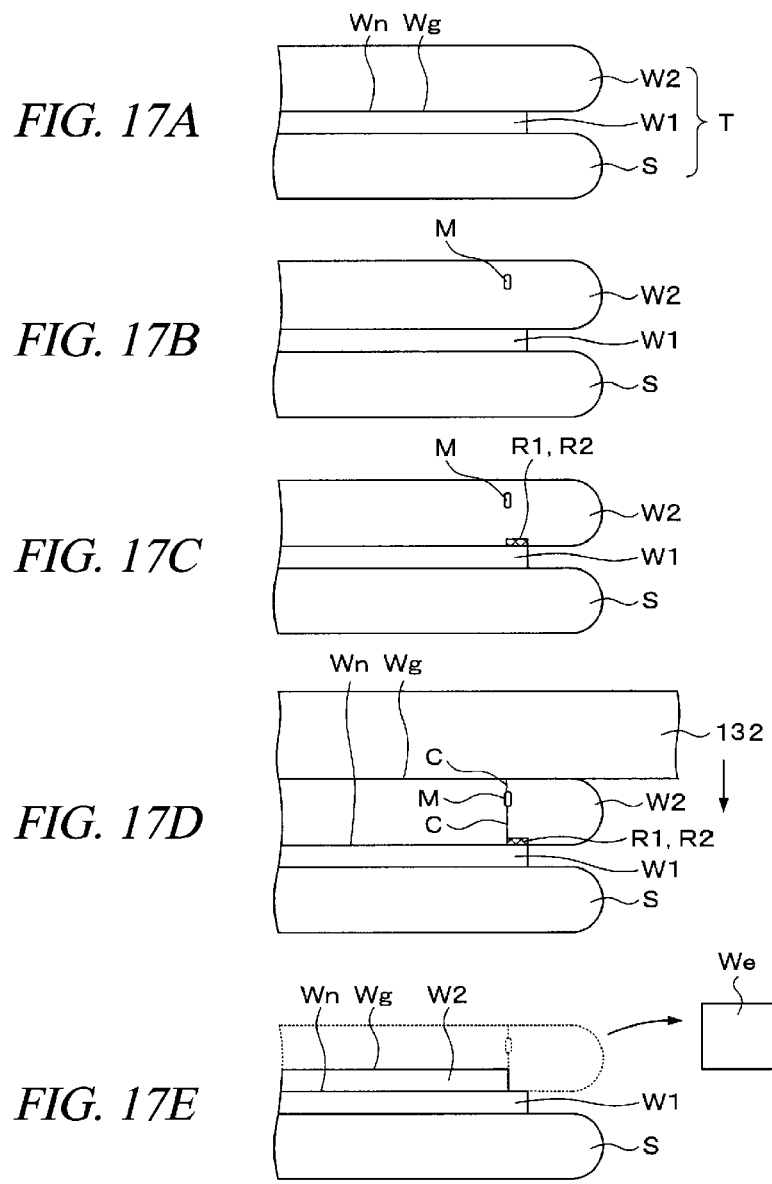
FIG. 17A to FIG. 17E are explanatory diagrams showing the processing wafer in main processes of a wafer processing according to a modification example of the first exemplary embodiment.

In the combined wafer T after being subjected to the wafer processing according to the exemplary embodiment, the peripheral portion We of the target wafer W is removed and the processing surface Wg is ground to the target thickness as shown in FIG. 17A.

As for this combined wafer T, the target wafer W are stacked and bonded to each other as shown in FIG. 17A in the bonding device (not shown) outside the substrate processing system 1. Further, the processing surface Wg of the first target wafer W1 is bonded to the non-processing surface Wn of the second target wafer W2 to form the combined wafer T.

Then, the combined wafer T in which the second target wafer W2 is bonded is transferred to the substrate processing system 1 while being accommodated in the cassette Ct. In the substrate processing system 1, the combined wafer T is transferred into the processing unit 90 of the processing device 50 by the wafer transfer device 32. In the processing unit 90, the combined wafer T is delivered onto the chuck and held thereon and then, the orientation of the horizontal direction of the second target wafer W2 is adjusted by the detector (not shown).

Further, in the processing unit 90, the chuck 91 is moved in the horizontal direction by the moving mechanism 92 to perform the centering of the combined wafer T, and the first laser head 94 is moved to above the peripheral portion We. Then, while the chuck 91 is rotated, the laser beam L is radiated into the second target wafer W2 from the first laser head 94. Thereafter, as shown in FIG. 17B, the modification layer M is formed at a predetermined position within the second target wafer W2. Also, the modification layer M is located more inwards in the diametric direction than an end of the first target wafer W1.

If the modification layer M is formed in the target wafer W, the modification layer M within the second target wafer W2 is imaged by the position detector 100 with infrared rays to detect the position of the modification layer M. The detection result by the position detector 100 is output to the control device 60. In the control device 60, the central axis of the chuck 91 or the irradiation axis of the laser beam L from the second laser head 97 is adjusted based on the detection result by the position detector 100, i.e., based on the position of the modification layer M.

Then, the first laser head 94 is retreated, and the second laser head 97 is moved to above the peripheral portion We under the control of the control device 60. Thereafter, while the chuck 91 is rotated, the second laser head 97 is moved outwards in the diametric direction and the laser beam is radiated from the second laser head 97. Thus, as shown in FIG. 17C, the modification surface R1 or R2 is formed within the second target wafer W2 or in the device layer D. The modification surface R1 or R2 is formed on an interface of the first target wafer W1 and the second target wafer W2 between the modification layer M and the peripheral portion of the first target wafer W1. In this case, as described above, the central axis of the chuck 91 or the irradiation axis of the laser beam L from the second laser head 97 is already adjusted, and, thus, the modification surface R1 or R2 can be appropriately formed in the target wafer W. As a result, the position of the modification layer M can be matched with the inner periphery position of the modification surface R1 or R2.

Further, the forming of the modification layer M shown in FIG. 17B and the forming of the modification surface R1 or R2 shown in FIG. 17C may be performed in reverse order.

Then, the combined wafer T is transferred onto the chuck 71 at the delivery position A0 by the transfer unit 80, and then, the chuck 71 is moved to the first processing position A1. Thereafter, in the rough grinding unit 130, the processing surface Wg of the second target wafer W2 is ground by the rough grinding whetstone 132 as shown in FIG. 17D. Here, as shown in FIG. 17E, the peripheral portion We is removed starting from the modification layer M and the crack C.

Thereafter, the chuck 71 is moved to the second processing position A2. Subsequently, the intermediate grinding is performed on the processing surface Wg of the second target wafer W2 by the intermediate grinding unit 140. Further, if the peripheral portion We cannot be completely removed by the rough grinding unit 130, the peripheral portion We is completely removed by the intermediate grinding unit 140.

Thereafter, the chuck 71 is moved to the third processing position A3. Then, the finishing grinding is performed on the processing surface Wg of the second target wafer W2 by the finishing grinding unit 150.

The subsequent processings to be performed on the second target wafer W2 are the same as those in the above-described exemplary embodiment. That is, the cleaning of the non-bonding surface Sn in the second cleaning unit 120, the cleaning of the processing surface Wg in the first cleaning unit 110 and the wet etching of the processing surface Wg in the wet etching devices 40 and 41 are performed. Thus, a series of wafer processings in the substrate processing system 1 is ended.

In the combined wafer T shown in FIG. 17A, when the peripheral portion We of the second target wafer W2 is removed with the wheel as in the conventional method, the non-processing surface Wn of the second target wafer W2 is hollow thereunder, and, thus, it is difficult to grind the peripheral portion We.

In this regard, in the present exemplary embodiment, the modification layer M is formed within the second target wafer W2, and, thus, the peripheral portion We can be easily removed starting from the modification layer M and the crack C.

Further, if the wheel and the blade are used as in the conventional method, there is a limitation in adjusting the position of the wheel and the blade in the horizontal direction, which results in a non-uniformity of several μm. Thus, the non-uniformity causes a non-uniformity in width (trim width) of the peripheral portion to be ground and removed by the wheel and the blade. Particularly, as the target wafers are stacked, the non-uniformity increases. Therefore, for example, the target wafer as the upper layer may be protruded from the target wafer as the lower layer.

In this regard, in the present exemplary embodiment, the modification layer M is formed inside the second target wafer W2 with the laser beam, and, thus, high accuracy can be secured. Therefore, the second target wafer W2 can be appropriately stacked.

Furthermore, in the present exemplary embodiment, the peripheral portion We to be removed from the second target wafer W2 as the upper layer is located more inwards than the peripheral portion We to be removed from the first target wafer W1 as the lower layer. That is, as shown in FIG. 17B, the modification layer M inside the second target wafer W2 is formed more inwards in the diametric direction than the end of the first target wafer W1. In this case, the diameter of the second target wafer W2 which is stacked last is smaller than the diameter of the first target wafer W1 as shown in FIG. 17E. Thus, it is possible to reliably suppress the second target wafer W2 from being protruded from the first target wafer W1.

Moreover, in the present exemplary embodiment, if the position of the peripheral portion We to be removed from the second target wafer W2 is matched with the position of the combined wafer T, the forming of the modification surface R1 or R2 may be omitted.

Also, in the present exemplary embodiment, the processing unit 90 may not be provided with the first laser head 94 and the second laser head 97 separately, and may be provided with a common head.

Besides, in the present exemplary embodiment, each of the first laser head 94 configured to form the modification layer M and the second laser head 97 configured to form the modification surface R1 or R2 is provided in the processing unit 90 configured to perform the alignment of the combined wafer T, but the configuration of the device is not limited thereto. A modification layer forming unit equipped with the first laser head 94, the moving mechanism 95 and the elevation mechanism 96 and an interface processing unit equipped with the second laser head 97, the moving mechanism 98 and the elevation mechanism 99 may be separately provided in the processing unit 90. The modification layer forming unit and the interface processing unit may be provided at any position within the range in which the transfer unit 80 can transfer the combined wafer T. For example, the modification layer forming unit and the interface processing unit may be provided to be stacked on the processing unit 90. Otherwise, the modification layer forming unit and the interface processing unit may be provided at a position adjacent to the processing unit 90 in the horizontal direction, for example, at a position opposite to the processing unit 90 with respect to the moving mechanism 83. Alternatively, any one of the modification layer forming unit and the interface processing unit may be placed inside the processing device 50. Otherwise, both the modification layer forming unit (modification layer forming device) and the interface processing unit (interface processing device) may be placed outside the processing device 50. The position detector 100 may be provided in a position detection unit inside the processing device 50 or may be provided in a position detection unit outside the processing device 50.

Figure 18:
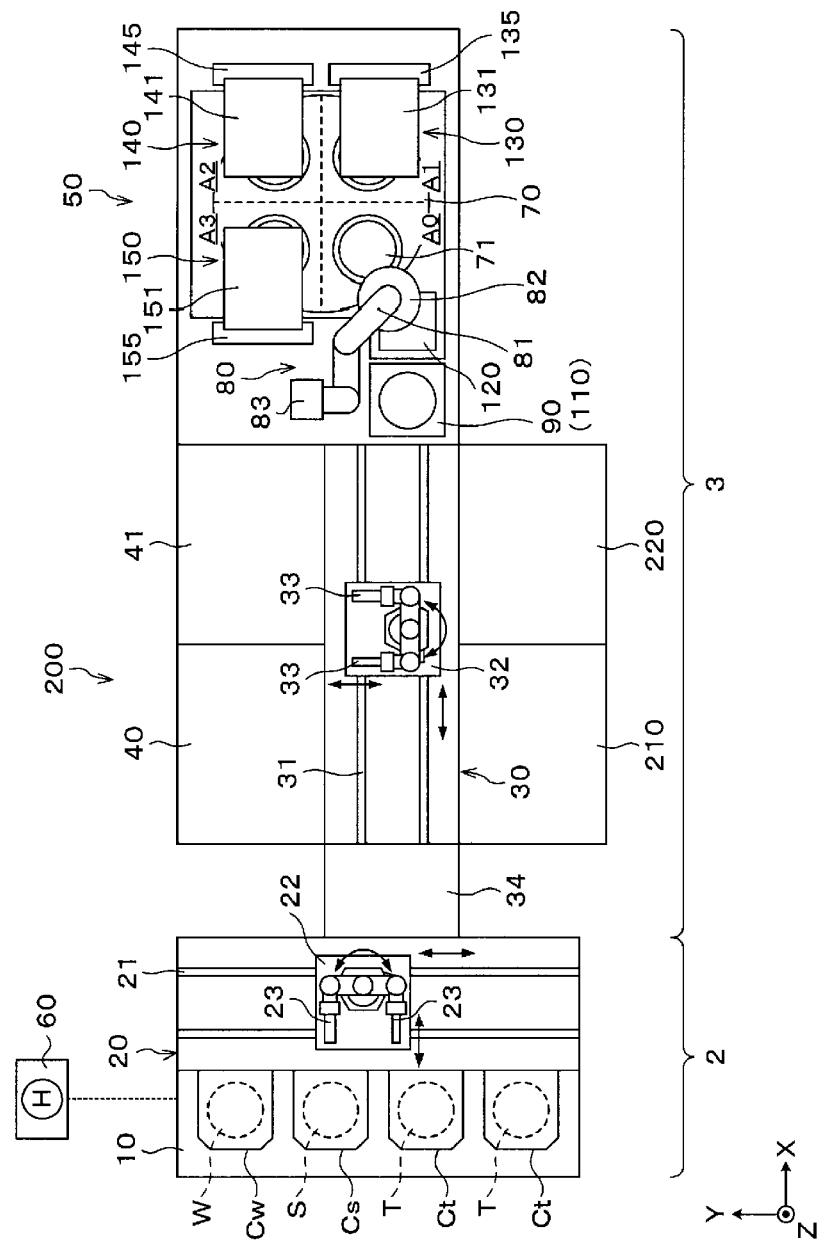
FIG. 18 is a schematic plan view illustrating a configuration of a substrate processing system according to a second exemplary embodiment.

Hereinafter, a configuration of a substrate processing system 200 according to a second exemplary embodiment will be described. FIG. 18 is a schematic plan view illustrating the configuration of the substrate processing system 200 according to the second exemplary embodiment.

The substrate processing system 200 further includes a bonding device 210 and an interface processing device 220 in the processing station 3 in addition to the configuration of the substrate processing system 1 according to the first exemplary embodiment. On the negative side of the Y-axis direction of the wafer transfer section 30, the bonding device 210 and the interface processing device 220 are arranged in this order from the carry-in/out station 2 in the X-axis direction. Further, in this case, cassettes Cw, Cs and Ct that can accommodate a plurality of target wafers W, a plurality of support wafers S and a plurality of combined wafers T, respectively, are carried into and out of the carry-in/out station 2. Furthermore, these cassettes Cw, Cs and Ct can be arranged in a row in the Y-axis direction on the cassette mounting table 10.

The bonding device 210 is configured to bond the non-processing surface Wn of the target wafer W to the bonding surface Sj of the support wafer S by van der Waals forces and hydrogen bond (intermolecular force). Desirably, each of the non-processing surface Wn and the bonding surface Sj is modified and hydrophilized during the bonding process. Specifically, when the non-processing surface Wn and the bonding surface Sj are modified, an oxygen gas or nitrogen gas as a processing gas is formed into plasma and ionized, for example, under a decompressed atmosphere. The oxygen ions or nitrogen ions are radiated onto the non-processing surface Wn and the bonding surface Sj, and, thus, the non-processing surface Wn and the bonding surface Sj are plasma-processed and activated. Also, pure water is supplied onto the modified non-processing surface Wn and bonding surface Sj to hydrophilize the non-processing surface Wn and the bonding surface Sj. The configuration of the bonding device 210 is arbitrary, and a bonding device known in the art may be used.

Figure 19:
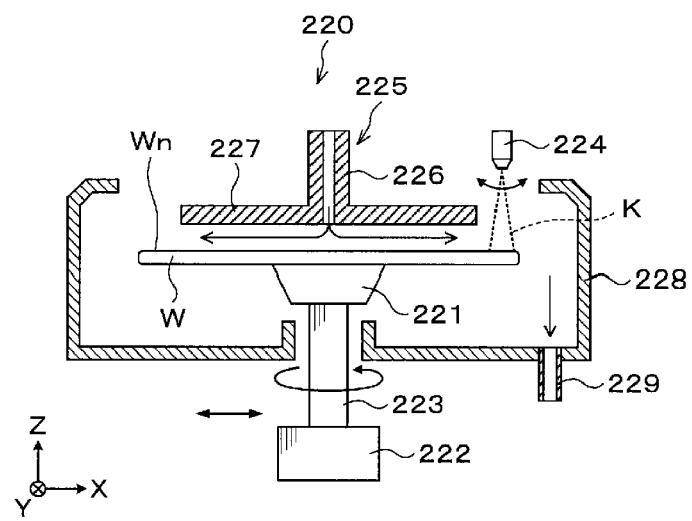
FIG. 19 is a schematic side view illustrating a configuration of an interface processing device.

As shown in FIG. 19, the interface processing device 220 is configured to perform a processing of reducing the bonding force at the interface between the target wafer W corresponding to the peripheral portion We to be removed and the support wafer S. Also, by reducing the bonding force, the peripheral portion We can be efficiently removed. Specifically, the interface processing device 220 is configured to radiate the laser beam onto, for example, the non-processing surface Wn of the target wafer W corresponding to the peripheral portion We to be removed to make it rough.

The interface processing device 220 is equipped with a chuck 221 configured to hold the target wafer W in a state where the non-processing surface Wn faces upwards. The chuck 221 is configured to be movable in the X-axis direction and in the Y-axis direction by a moving mechanism 222. The moving mechanism 222 is configured as a general precise XY stage. Further, the chuck 221 is configured to be pivotable around a vertical axis by a rotation mechanism 223.

A laser head 224 configured to radiate a laser beam K onto the non-processing surface Wn in the peripheral portion We of the target wafer W is provided above the chuck 221. The laser beam K radiated from the laser head 224 is arbitrary and may be, for example, an excimer laser beam or a fiber laser beam. Although the device layer D and the oxide film Fw are formed on the non-processing surface Wn as described above, for example, an ultraviolet ray can sufficiently serve as the laser beam. The laser head 224 may also be configured to be movable in the X-axis direction, in the Y-axis direction and in the Z-axis direction by a moving mechanism (not shown).

An irradiation hole of the laser beam K from the laser head 224 is configured to be movable in the horizontal direction by a moving mechanism (not shown). For example, the moving mechanism may move the irradiation hole of the laser head 224 mechanically or move the irradiation hole by an acoustic element. The laser beam is absorbed by the oxide film Fw, and, thus, the focusing point does not need to be strictly controlled. For this reason, as in the present exemplary embodiment, the irradiation hole of the laser head 224 may be moved by the moving mechanism to modify and roughen the non-processing surface Wn (the oxide film Fw) in the peripheral portion We.

A gas supply 225 configured to supply a gas to the target wafer W is provided above the chuck 221. The gas supplied from the gas supply 225 may be an inert gas such as clean air or a nitrogen gas. The gas supply 225 is equipped with a nozzle 226 configured to supply the gas and a rectifying plate 227 configured to rectify the gas supplied from the nozzle 226. The nozzle 226 communicates with a gas source (not shown) configured to store and supply the gas. Also, a gas supply opening of the nozzle 226 is formed above the center of the target wafer W. The rectifying plate 227 is provided substantially parallel with the target wafer W held on the chuck 221 and controls the gas from the nozzle 226 to flow on the non-processing surface Wn of the target wafer W.

A cup 228 configured to collect and exhaust the gas from the gas supply 225 is provided around the chuck 221. A gas exhaust pipe 229 configured to discharge the gas is connected to a lower surface of the cup 228. The cup 228 may be configured to surround the entire circumference of the target wafer W or locally surround only the laser head 224.

In the interface processing device 220, the target wafer W is held first by the chuck 221 and then, the chuck 221 is moved in the horizontal direction by the moving mechanism 222 to perform centering of the target wafer W. Then, while the chuck 221 is rotated by the rotation mechanism 223, the laser beam K is radiated from the laser head 224 onto the non-processing surface Wn in the peripheral portion We of the target wafer W to roughen the non-processing surface Wn.

Also, when the non-processing surface Wn is roughened, the gas is supplied from the gas supply 225 onto the non-processing surface Wn of the target wafer W. The supplied gas flows on the entire surface of the non-processing surface Wn and then is exhausted through the gas exhaust pipe 229. If the non-processing surface Wn in the peripheral portion We is modified with the laser beam as in the present exemplary embodiment, debris (waste) may be generated. If the debris is attached to the non-processing surface Wn in the central portion Wc, the device can be damaged. Therefore, the purge is performed by supplying the gas from the gas supply 225 to suppress the attachment of the debris to the non-processing surface Wn. Further, after the interface processing in the interface processing device 220, the non-processing surface Wn may be cleaned in another cleaning device (not shown). In this case, for example, in comparison with the case that the components configured to allow the gas to flow between the rectifying plate 227 and the target wafer W are not provided, the cleaning is performed in the interface processing device 220 in the present exemplary embodiment, so that cleaning in another cleaning device can be slightly suppressed.

Figure 20:
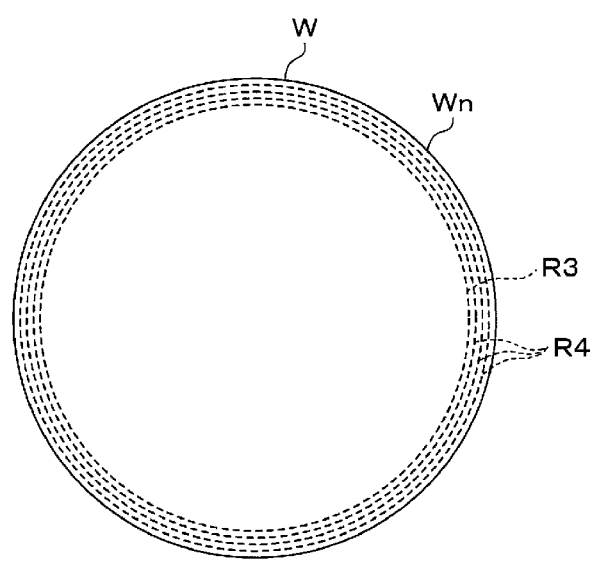
FIG. 20 is a plan view illustrating modification grooves formed in the target wafer.
Figure 21:
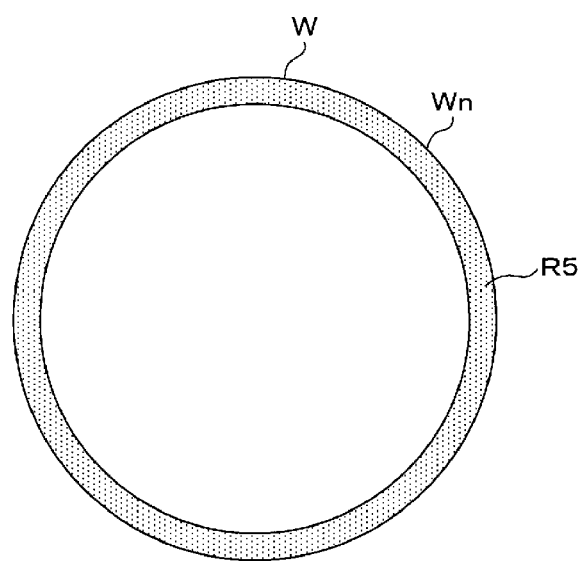
FIG. 21 is a plan view illustrating the modification surface formed in the target wafer.

At the position where the non-processing surface Wn is roughened, a modification groove R3 may be formed by modifying, for example, a boundary between the non-processing surface Wn corresponding to the peripheral portion We to be removed and the non-processing surface Wn of the target wafer W corresponding to the central portion Wc not to be removed as shown in FIG. 20. Also, a plurality of annular modification grooves R4 may be formed outside the modification groove R3. Otherwise, a roughened modification surface R5 may be formed by modifying a portion corresponding to the peripheral portion We into a planar shape as shown in FIG. 21. In this case, the modification surface R5 may be formed of the plurality of modification grooves R4 or the modification surface R5 may be formed by adjusting an irradiation range of the laser beam.

Further, according to the present exemplary embodiment, in the interface processing device 220, the modification grooves R3 and R4 or the modification surface R5 is formed, and the processing unit 90 does not include the second laser head 97, the moving mechanism 98 and the elevation mechanism 99.

Hereinafter, wafer processings to be performed by the substrate processing system 200 configured as described above will be described. In the present exemplary embodiment, detailed description of the same processings as those in the first exemplary embodiment will be omitted.

Figure 22A:
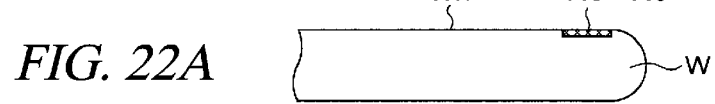
FIG. 22A to FIG. 22E are explanatory diagrams showing the target wafer in main processes of the wafer processing.

First, a target wafer W is taken out of the cassette Cw and transferred into the transition device 34 by the wafer transfer device 22. Thereafter, the target wafer W is taken out of the transition device 34 and transferred into the interface processing device 220 by the wafer transfer device 32. In the interface processing device 220, the non-processing surface Wn (the oxide film Fw) in the peripheral portion We of the target wafer W is modified to form any one of the roughened modification grooves R3 and R4 and modification surface R5 as shown in FIG. 22A. Here, the width of the modification grooves R3 and R4 or the modification surface R5 (the position of the inner end in the diametric direction) is determined depending on the width of the peripheral portion We to be removed from the target wafer W.

Also, while the non-processing surface Wn is roughened in the interface processing device 220, a support wafer S is taken out of the cassette Cs by the wafer transfer device 22 and then transferred into the bonding device 210 by the wafer transfer device 32 via the transition device 34.

Figure 22B:
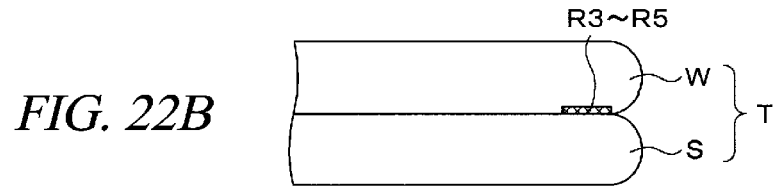

Then, the target wafer W is transferred into the bonding device 210 by the wafer transfer device 22. Here, the front and the rear surfaces of the target wafer W are inverted by the wafer transfer device 22 or an inversion device (not shown). In the bonding device 210, the target wafer W and the support wafer S are bonded to each other to form the combined wafer T as shown in FIG. 22B.

Thereafter, the combined wafer T is transferred into the processing unit 90 of the processing device 50 by the wafer transfer device 32. In the processing unit 90, the combined wafer T is delivered onto the chuck 91 and held thereon. Then, the orientation of the horizontal direction of the target wafer W is adjusted by the detector (not shown).

Further, in the processing unit 90, the modification grooves R3 and R4 or the modification surface R5 of the target wafer W is imaged by the position detector 100 with infrared rays to detect the inner periphery position of the modification grooves R3 and R4 or the modification surface R5. The detection result by the position detector 100 is output to the control device 60. In the control device 60, the central axis of the chuck 91 or the irradiation axis of the laser beam L from the first laser head 94 is adjusted based on the detection result by the position detector 100, i.e., based on the inner periphery position of the modification grooves R3 and R4 or the modification surface R5.

Figure 22C:
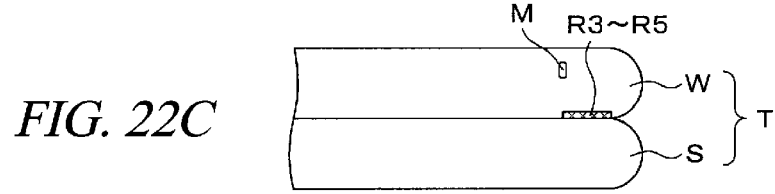

Then, the first laser head 94 is moved to above the peripheral portion We under the control of the control device 60. Thereafter, while the chuck 91 is rotated by the rotation mechanism 93, the laser beam L is radiated from the first laser head 94 into the target wafer W. Thus, as shown in FIG. 22C, the modification layer M is formed at a predetermined position within the target wafer W. In this case, as described above, the central axis of the chuck 91 or the first laser head 94 is already adjusted, and, thus, the modification layer M can be appropriately formed in the target wafer W. As a result, the position of the modification layer M can be matched with the inner periphery position of the modification grooves R3 and R4 or the modification surface R5.

Figure 22D:
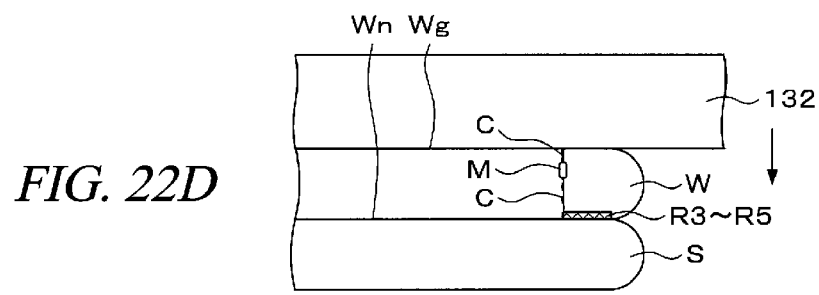
Figure 22E:
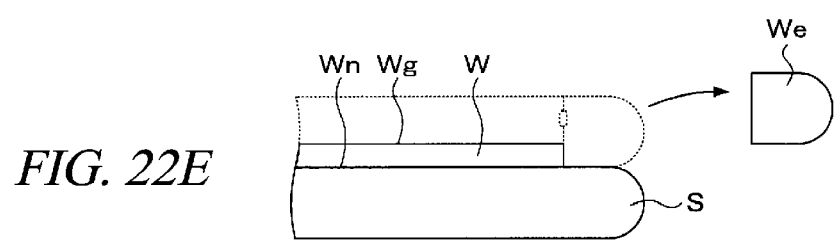

Then, the combined wafer T is delivered onto the chuck 71 at the delivery position A0 by the transfer unit 80, and the chuck 71 is moved to the first processing position A1. Thereafter, in the rough grinding unit 130, the processing surface Wg of the target wafer W is ground by the rough grinding whetstone 132 as shown in FIG. 22D. Here, as shown in FIG. 22E, the peripheral portion We is removed starting from the modification layer M and the crack C. Further, since the interface (the non-processing surface Wn) between the target wafer W and the support wafer S is roughened so that the bonding force is reduced, the peripheral portion We can be appropriately removed.

Subsequently, the chuck 71 is moved to the second processing position A2. Then, the intermediate grinding is performed on the processing surface Wg of the target wafer W by the intermediate grinding unit 140. Further, if the peripheral portion We cannot be completely removed by the rough grinding unit 130, the peripheral portion We is completely removed by the intermediate grinding unit 140.

Then, the chuck 71 is moved to the third processing position A3. Thereafter, the finishing grinding is performed on the processing surface Wg of the target wafer W by the finishing grinding unit 150.

The subsequent processings to be performed on the target wafer W are the same as those in the above-described exemplary embodiment. That is, the cleaning of the non-bonding surface Sn in the second cleaning unit 120, the cleaning of the processing surface Wg in the first cleaning unit 110 and the wet etching of the processing surface Wg in the wet etching devices 40 and 41 are performed. Thus, a series of wafer processings in the substrate processing system 200 is ended.

The second exemplary embodiment can also obtain the same effects as the first exemplary embodiment.

Also, in the present exemplary embodiment, after the modification grooves R3 and R4 or the modification surface R5 is formed in the target wafer W as shown in FIG. 22A, the target wafer W and the support wafer S are bonded to each other as shown in FIG. 22B and then, the modification layer M is formed in the target wafer W as shown in FIG. 22C. However, the order of these processings is not limited thereto. For example, the forming of the modification grooves R3 and R4 or the modification surface R5, the forming of the modification layer M and the bonding of the wafers W and S may be performed in this order. Otherwise, for example, the forming of the modification layer M, the forming of the modification grooves R3 and R4 or the modification surface R5 and the bonding of the wafers W and S may be performed in this order. For another example, the forming of the modification layer M, the bonding of the wafers W and S and the forming of the modification grooves R3 and R4 or the modification surface R5 may be performed in this order.

Prior to the laser processing in the interface processing device 220, a protection film may be formed on the non-processing surface Wn. In this case, the processing station 3 of the substrate processing system 200 is provided with a coating device (not shown) configured to form the protection film and a cleaning device (not shown) configured to clean the protection film. The coating device coats the entire surface of the non-processing surface Wn with a protection material to form the protection film by, for example, spin coating. Further, the cleaning device supplies a cleaning solution onto the entire surface of the non-processing surface Wn to clean and remove the protection film by, for example, spin cleaning.

Further, in the substrate processing system 200, the protection film is formed first on the entire surface of the non-processing surface Wn by the coating device. Thereafter, in the interface processing device 220, the non-processing surface Wn in the peripheral portion We is modified as shown in FIG. 22A. Here, the protection film is formed on the central portion Wc of the target wafer W, and, thus, even if the debris is caused by the laser beam, it is possible to suppress the damage to the device. Further, after the cleaning device cleans and removes the protection film of the non-processing surface Wn, the target wafer W and the support wafer S can be bonded to each other as shown in FIG. 22B.

Further, the above-described second exemplary embodiment can also be applied to a case where the second target wafer W2 is further stacked in the combined wafer T as shown in FIG. 17A to FIG. 17E. That is, the interface processing device 220 detects the position of the modification layer M or the position of the modification grooves R3 and R4 or the modification surface R5 in the second target wafer W2. The position of the modification layer M can be matched with the inner periphery position of the modification grooves R3 and R4 or the modification surface R5 based on the detection result.

In the above-described exemplary embodiment, the bonding force at the interface between the target wafer W corresponding to the peripheral portion We to be removed and the support wafer S is reduced by the interface processing device 220, but a method of reducing the bonding force is not limited thereto. Examples of the method of reducing the bonding force may include the following four methods.

Figure 23:
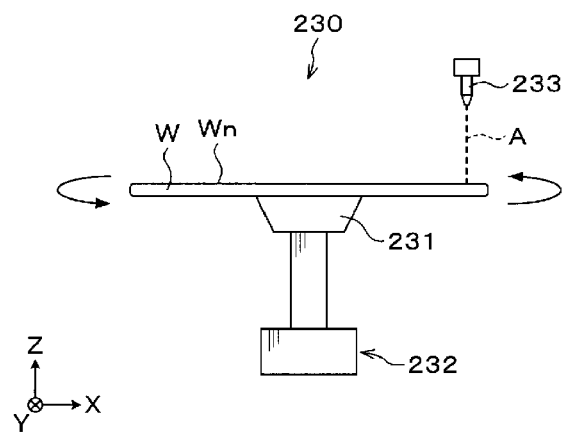
FIG. 23 is a schematic side view illustrating the configuration of the interface processing device.

For example, to reduce the bonding force, the non-processing surface Wn of the target wafer W corresponding to the peripheral portion We to be removed may be coated with a releasing agent to form a releasing film. Specifically, for example, an interface processing device 230 shown in FIG. 23 is used. The interface processing device 230 is provided instead of the interface processing device 220, for example, in the processing station 3 of the substrate processing system 200.

The interface processing device 230 is equipped with a chuck 231 configured to hold the target wafer W in a state where the non-processing surface Wn faces upwards. The chuck 231 is configured to be pivotable around a vertical axis by a rotation mechanism 232.

A nozzle 233 through which a releasing agent A is coated on the non-processing surface Wn in the peripheral portion We of the target wafer W is provided above the chuck 231. The nozzle 233 communicates with a releasing agent source (not shown) that stores and supplies the releasing agent A. Also, the nozzle 233 may also be configured to be movable in the X-axis direction, in the Y-axis direction and in the Z-axis direction by a moving mechanism (not shown). The releasing agent A may be a certain material that can reduce the bonding force at the interface between the target wafer W and the support wafer S.

In a wafer processing method performed by the substrate processing system 200 equipped with the above-described interface processing device 230, the laser processing by the interface processing device 220 according to the method shown in FIG. 22A to FIG. 22E is replaced with the releasing agent coating processing by the interface processing device 230. In the interface processing device 230, while the chuck 231 is rotated, the releasing agent A from the nozzle 233 is coated on the non-processing surface Wn in the peripheral portion We to form the releasing film on the non-processing surface Wn. Further, the bonding force between the target wafer W and the support wafer S is reduced in the peripheral portion We due to the releasing film. Therefore, the peripheral portion We can be appropriately removed as shown in FIG. 22E.

Further, if the rotation speed of the chuck 231 in the interface processing device 230 is high, the coated releasing agent A is shaken off to the outside of the target wafer W by centrifugal force. Meanwhile, if the rotation speed of the chuck 231 is medium, the releasing agent A can enter the processing surface Wg of the target wafer W, and, thus, a rinse solution for the releasing agent A may be supplied from a side of the processing surface Wg. Furthermore, if the rotation speed of the chuck 231 is low, the releasing agent A may be sucked and drained from the outside of the target wafer W. Also, in the present exemplary embodiment, the releasing agent A is coated on the non-processing surface Wn of the target wafer W before being bonded as described above, and the same processing may also be performed on the bonding surface Sj of the support wafer S.

Also, as the method of reducing the bonding force, if the bonding device 210 is, for example, a bonding device using plasma as described above, when the bonding is performed, the plasma may be radiated to the non-processing surface Wn of the target wafer W corresponding to the peripheral portion We to be removed. As described above, in the bonding device 210, plasmarized oxygen ions or nitrogen ions are radiated to the non-processing surface Wn so that the non-processing surface Wn is plasma-processed to be activated. Therefore, in the bonding device 210, a shielding plate may be provided above the non-processing surface Wn in order to suppress the irradiation of the oxygen ions or the nitrogen ions to the non-processing surface Wn in the peripheral portion We.

In this case, in the bonding device 210, the non-processing surface Wn in the central portion Wc of the target wafer W is activated by the oxygen ions or the nitrogen ions, but, the non-processing surface Wn in the peripheral portion We is not activated. Thus, as shown in FIG. 22B, when the target wafer W and the support wafer S are bonded to each other by the bonding device 210, the target wafer W and the support wafer S are not bonded to each other in the peripheral portion We. For this reason, the peripheral portion We can be appropriately removed as shown in FIG. 22E. Also, in the present exemplary embodiment, the peripheral portion We is configured not to be activated in the non-processing surface Wn of the target wafer W before being bonded as described above, and the same processing may also be performed on the bonding surface Sj of the support wafer S.

Figure 24:
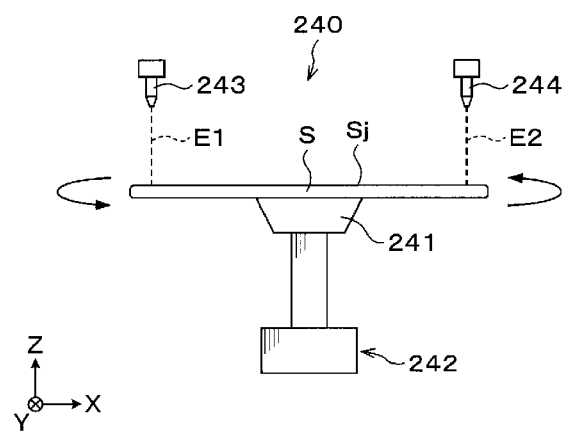
FIG. 24 is a schematic side view illustrating the configuration of the interface processing device.

Further, as the method of reducing the bonding force, for example, the bonding surface Sj of the support wafer S corresponding to the peripheral portion We to be removed may be etched. Specifically, for example, an interface processing device 240 shown in FIG. 24 is used. The interface processing device 240 is provided instead of the interface processing device 220, for example, in the processing station 3 of the substrate processing system 200.

The interface processing device 240 is equipped with a chuck 241 configured to hold the support wafer S in a state where the bonding surface Sj faces upwards. The chuck 241 is configured to be pivotable around a vertical axis by a rotation mechanism 242.

A first nozzle 243 serving as a first liquid supply configured to supply a first etching solution E1 to the bonding surface Sj of the support wafer S and a second nozzle 244 serving as a second liquid supply configured to supply a second etching solution E2 are provided above the chuck 241. The nozzles 243 and 244 communicate with etching solution sources (not shown) configured to store and supply the etching solutions E1 and E2, respectively. Also, the nozzles 243 and 244 may also be configured to be movable in the X-axis direction, in the Y-axis direction and in the Z-axis direction by moving mechanisms (not shown), respectively.

The first etching solution E1 etches the oxide film Fs formed on the bonding surface Sj of the support wafer S. The first etching solution E1 may be, for example, hydrogen fluoride (HF) or the like. The second etching solution E2 etches the bonding surface Sj, i.e., silicon, of the support wafer S. The second etching solution E2 may be, for example, tetramethyl ammonium hydroxide (TMAH), choline, potassium hydroxide (KOH) or the like.

Figure 25A:
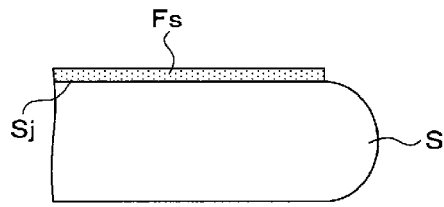
FIG. 25A to FIG. 25D are explanatory diagrams showing a support wafer in main processes of the wafer processing.
Figure 25B:
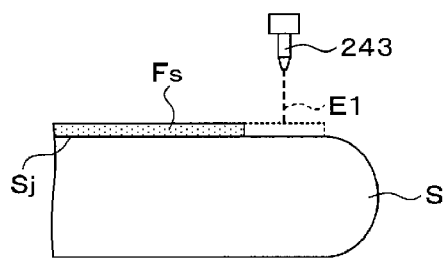

In this case, as for the support wafer S transferred into the interface processing device 240, the oxide film Fs is formed on the bonding surface Sj as shown in FIG. 25A. Then, as shown in FIG. 25B, while the chuck 241 is rotated, the first etching solution E1 is supplied to a peripheral portion of the oxide film Fs from the first nozzle 243 to etch the peripheral portion of the oxide film Fs. Also, in the present exemplary embodiment, an end of the etched oxide film Fs is matched with a position, which will be described later, where the modification layer M is formed, i.e., an end of the peripheral portion We to be removed.

Figure 25C:
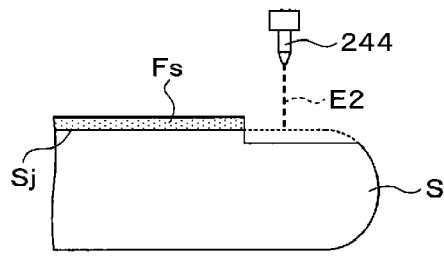

Then, as shown in FIG. 25C, while the chuck 241 is rotated, the second etching solution E2 is supplied to a peripheral portion of the bonding surface Sj of the support wafer S from the second nozzle 244 to etch the peripheral portion of the bonding surface Sj (silicon portion). Here, since TMAH, choline, KOH or the like is used as the second etching solution E2, the oxide film Fs is not etched and the bonding surface Sj is etched with the oxide film Fs as a mask. Further, the bonding surface Sj is etched to, for example, several μm in a thickness direction.

Figure 25D:
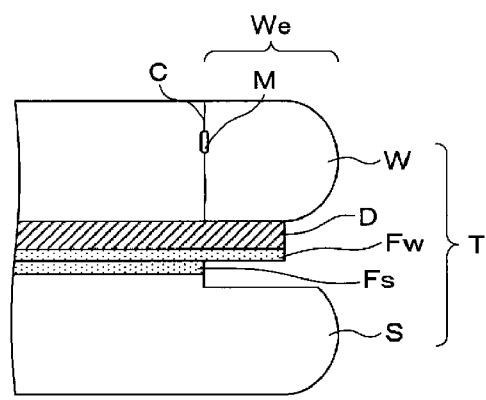

Thereafter, each of the support wafer S after being etched and the target wafer W is transferred into the bonding device 210. In the bonding device 210, the target wafer W and the support wafer S are bonded to each other as shown in FIG. 25D to form the combined wafer T. Here, in the peripheral portion We, the target wafer W and the support wafer S are not bonded to each other.

Subsequently, the combined wafer T is transferred into the processing unit 90 of the processing device 50. In the processing unit 90, the position of the end of the oxide film Fs is detected by the position detector 100 with infrared rays. The detection result by the position detector 100 is output to the control device 60. In the control device 60, the central axis of the chuck 91 or the irradiation axis of the laser beam L from the first laser head 94 is adjusted based on the detection result by the position detector 100, i.e., based on the position of the end of the oxide film Fs.

Then, the first laser head 94 is moved to above the peripheral portion We under the control of the control device 60. Thereafter, while the chuck 91 is rotated by the rotation mechanism 93, the laser beam L is radiated from the first laser head 94 into the target wafer W. Thus, as shown in FIG. 25D, the modification layer M is formed within the target wafer W. In this case, as described above, the central axis of the chuck 91 or the irradiation axis of the first laser head 94 is already adjusted, and, thus, the modification layer M can be appropriately formed in the target wafer W. As a result, the position of the modification layer M can be matched with the position of the end of the oxide film Fs.

Then, in the rough grinding unit 130, when the processing surface Wg of the target wafer W is ground, the peripheral portion We is removed starting from the modification layer M and the crack C. Here, the target wafer W and the support wafer S are not bonded to each other, and, thus, the peripheral portion We can be appropriately removed.

Here, for example, if the film thickness of the oxide film Fs is small, even when only the oxide film Fs is etched, the peripheral portion We can re-adhere thereto again after the target wafer W and the support wafer S are bonded to each other. Accordingly, in the present exemplary embodiment, the bonding surface Sj of the support wafer S is also etched in addition to the oxide film Fs, and, thus, it is possible to suppress the re-adhesion of the peripheral portion We. Therefore, a non-bonding region between the target wafer W and the support wafer S in the peripheral portion We can be maintained. Further, for example, if the film thickness of the oxide film Fs is sufficiently large, the etching of the bonding surface Sj may be omitted.

In the present exemplary embodiment, an alkaline solution is used as the second etching solution E2. In this case, if the bonding surface Sj of the support wafer S is etched with the second etching solution E2, the bonding surface Sj is roughened. Thus, it is possible to more reliably suppress the bonding of the target wafer W and the support wafer S and the re-adhesion in the peripheral portion We.

Figure 26:
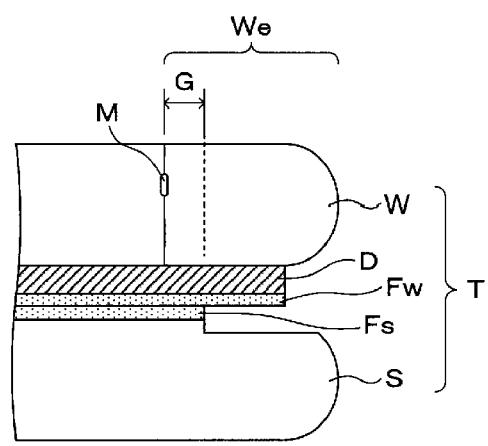
FIG. 26 is a longitudinal cross sectional view illustrating the modification layer formed more inwards in a diametric direction than an end of an oxide film.

Further, in the present exemplary embodiment, the position of the end of the etched oxide film Fs is matched with the position of the modification layer M as shown in FIG. 25D. However, the modification layer M may be formed more inwards in the diametric direction than the end of the oxide film Fs as shown in FIG. 26. In other words, the oxide film Fs may be etched more outwards in the diametric direction than the modification layer M.

In this case, when the modification layer M is formed with the laser beam L from the first laser head 94, even if the modification layer M is formed while deviated from the end of the oxide film Fs due to, for example, a processing error or the like, it is possible to suppress the forming of the modification layer M outside of the end of the oxide film Fs in the diametric direction. Here, if the modification layer M is formed more outwards in the diametric direction than the end of the oxide film Fs, the target wafer W is made to float from the support wafer S after the peripheral portion We is removed. Accordingly, in the present exemplary embodiment, it is possible to reliably suppress such a state of the target wafer W.

Also, as a result of intensive examination of the present inventors, if a distance G between the end of the oxide film Fs and the modification layer M is sufficiently small, the peripheral portion We can be appropriately removed. Desirably, the distance G is less than 500 μm.

In the example shown in FIG. 26, the modification layer M is formed more inwards in the diametric direction than the end of the oxide film Fs. Likewise, even in the above-described exemplary embodiments, the modification layer M may be formed more inwards in the diametric direction than the end of the modification surface R1 or R2, the modification grooves R3 and R4 or the modification surface R5.

Further, in the present exemplary embodiment, the bonding surface Sj of the support wafer S is etched before being bonded. However, for example, the oxide film Fw formed on the non-processing surface Wn of the target wafer W corresponding to the peripheral portion We to be removed may be etched. For example, hydrogen fluoride (HF) is used as the etching solution.

In this case, the etching of the peripheral portion We is performed instead of the laser processing by the interface processing device 220 shown in FIG. 22A. The etched peripheral portion We is removed, resulting in a step with respect to the central portion Wc, or the etched peripheral portion We is roughened. Thus, when the target wafer W and the support wafer S are bonded to each other by the bonding device 210 as shown in FIG. 22B, the target wafer W and the support wafer S are not bonded to each other in the peripheral portion We. For this reason, the peripheral portion We can be appropriately removed as shown in FIG. 22E.

Figure 27:
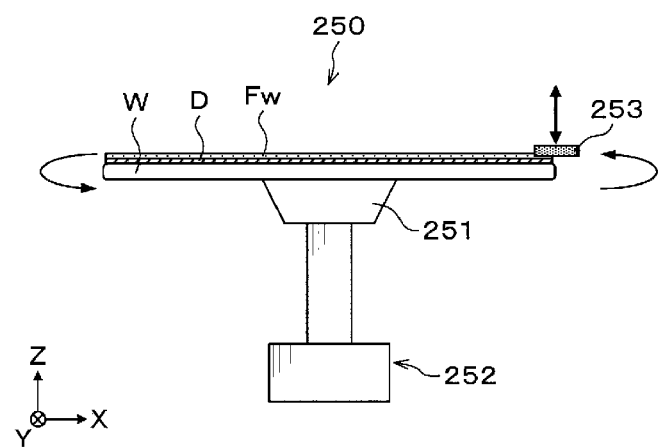
FIG. 27 is a schematic side view illustrating the configuration of the interface processing device.

Furthermore, as the method of reducing the bonding force, for example, the oxide film Fw formed on the non-processing surface Wn of the target wafer W corresponding to the peripheral portion We to be removed may be polished. Specifically, for example, an interface processing device 250 shown in FIG. 27 is used. The interface processing device 250 is provided instead of the interface processing device 220, for example, in the processing station 3 of the substrate processing system 200.

The interface processing device 250 is equipped with a chuck 251 configured to hold the target wafer W in a state where the oxide film Fw faces upwards. The chuck 251 is configured to be pivotable around a vertical axis by a rotation mechanism 252.

A polishing member 253 configured to be pressed against a peripheral portion of the oxide film Fw to remove the peripheral portion of the oxide film Fw is provided above the chuck 251. The polishing member 253 is also configured to be movable in the Z-axis direction by a moving mechanism (not shown).

As describe above, the peripheral portion of the oxide film Fw is removed with the polishing member 253, and, thus, the target wafer W and the support wafer S are not bonded to each other in the peripheral portion We. Therefore, the peripheral portion We can be appropriately removed in a subsequent processing. Also, a damage layer is formed on the surface of the oxide film Fw, and, thus, it is possible to suppress the re-adhesion of the target wafer W and the support wafer S and possible to maintain the non-bonding region.

Further, the surface particle size of the polishing member 253, i.e., the abrasive grain diameter of the polishing member 253, can be arbitrarily selected, and, thus, the film removal rate of the oxide film Fw and the surface roughness of the oxide film Fw after the film removal can be arbitrarily adjusted. Therefore, it is possible to more appropriately suppress the re-adhesion of the non-bonding region.

Furthermore, in the present exemplary embodiment, the oxide film Fw of the target wafer W is polished, and the same processing may also be performed on the oxide film Fs of the support wafer S.

In the processing unit 90 according to the above-described exemplary embodiment, the modification layer M is formed at a single position so that the lower end thereof can be located above the target surface of the target wafer W after being ground as shown in FIG. 6. However, the method of forming the modification layer M is not limited thereto. As shown in FIG. 28A to FIG. 28D, a plurality of modification layers M may be formed in a thickness direction of the target wafer W.

Figure 28A:
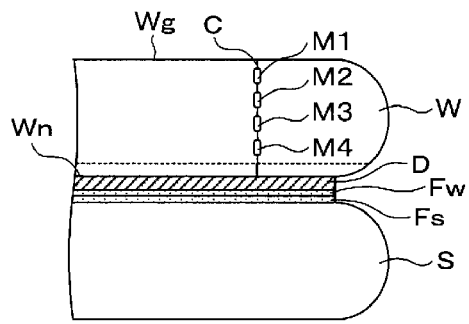
FIG. 28A to FIG. 28D are longitudinal cross sectional views illustrating the modification layer formed in the target wafer according to another exemplary embodiment.

In the example shown in FIG. 28A, modification layers M1 to M4 are formed into a plurality of stages, for example, four stages, in the thickness direction of the target wafer W.

A lower end of the lowermost modification layer M4 is located above the target surface (indicated by a dotted line in FIG. 28A) of the target wafer W after being ground. Also, the crack C extending from these modification layers M1 to M4 reaches the processing surface Wg and the non-processing surface Wn of the target wafer W.

Figure 28B:
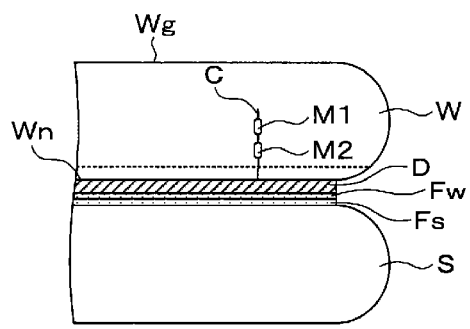

In the example shown in FIG. 28B, modification layers M1 and M2 are formed into a plurality of stages, for example, two stages, in the thickness direction of the target wafer W. A lower end of the lower modification layer M2 is located above the target surface (indicated by a dotted line in FIG. 28B) of the target wafer W after being ground. Also, the crack C extending from these modification layers M1 and M2 reaches the non-processing surface Wn of the target wafer W, but does not reach the processing surface Wg. In this case, for example, when the rough grinding whetstone 132 is lowered to grind the processing surface Wg in the rough grinding unit 130, the processing surface Wg including the peripheral portion We of the target wafer W is ground until a grinding surface of the rough grinding whetstone 132 reaches the crack C. Then, when the grinding surface of the rough grinding whetstone 132 reaches the crack C, the peripheral portion We located under the crack C is peeled off to be removed. As such, a height of an upper end of the crack C elongated from the modification layers M1 and M2 is adjusted to a predetermined position, and, thus, the size (height) of segments of the peripheral portion We to be removed can be controlled.

Figure 28C:
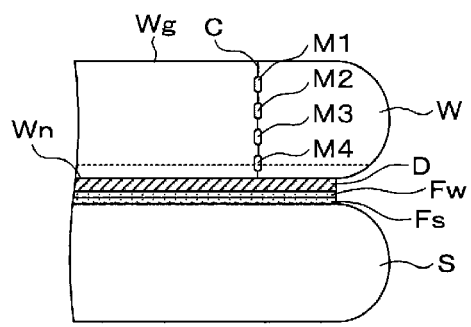

In the example shown in FIG. 28C, modification layers M1 to M4 are formed into a plurality of stages, for example, four stages, in the thickness direction of the target wafer W. A lower end of the lowermost modification layer M4 is located under the target surface (indicated by a dotted line in FIG. 28C) of the target wafer W after being ground. Also, the crack C extending from these modification layers M1 to M4 reaches the processing surface Wg and the non-processing surface Wn of the target wafer W. In this case, the modification layer M4 is formed at the boundary between the peripheral portion We and the central portion Wc of the target wafer W after being ground, and, thus, the peripheral portion We can be more reliably peeled off to be removed. Further, if the modification layer M4 is formed under the target surface as described above, the focusing of the laser beam is blurred to make it difficult to generate the crack C extending from the modification layer M4. Thus, it is possible to suppress the generation of the crack C even in the support wafer S bonded to the target wafer W. The position of the crack C changes in the entire circumferential direction, but the lower end of the modification layer M4 can be controlled as such. Therefore, it can be removed with high accuracy.

Figure 28D:
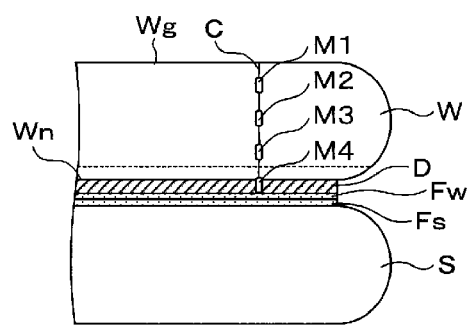

In the example shown in FIG. 28D, modification layers M1 to M4 are formed into a plurality of stages, for example, four stages, in the thickness direction of the target wafer W. A lower end of the lowermost modification layer M4 is located within the device layer D. Also, the crack C extending from these modification layers M1 to M4 reaches the processing surface Wg of the target wafer W. Even in this case, the modification layer M4 is formed at the boundary between the peripheral portion We and the central portion Wc of the target wafer W after being ground, and, thus, the peripheral portion We can be more reliably peeled off to be removed.

Further, as described above with reference to FIG. 10, if the modification surface R2 is formed in the device layer D, the ablation of the device layer D in the peripheral portion We may affect the device layer D in the central portion Wc inside the peripheral portion We. In this case, as shown in FIG. 28D, it is desirable to form the modification layer M4 in the device layer D and then form the modification surface R2. The modification layer M4 functions to stop the effect of the ablation and thus can reliably suppress the effect of ablation on the central portion Wc.

Figure 29A:
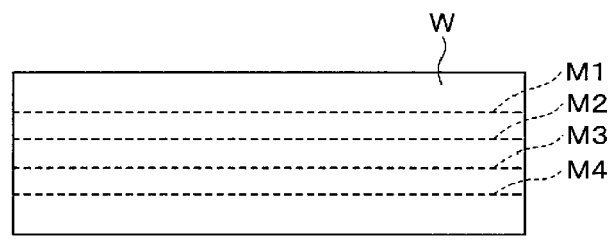
FIG. 29A to FIG. 29C are explanatory diagrams showing that the modification layer is formed in the target wafer according to yet another exemplary embodiment.
Figure 29B:
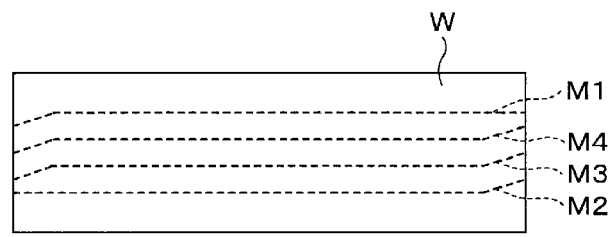
Figure 29C:
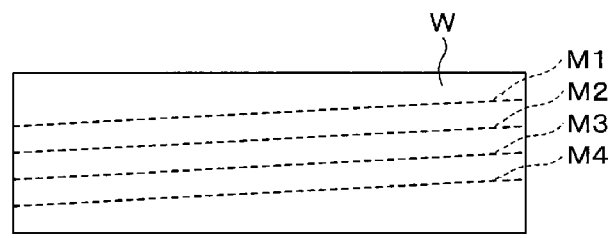

The method of forming modification layers M in the thickness direction of the target wafer W as shown in FIG. 28A to FIG. 28D is arbitrary, but may include, for example, three processing methods as shown in FIG. 29A to FIG. 29C. FIG. 29A to FIG. 29C are plan views of a portion (a boundary between the peripheral portion We and the central portion Wc) where the modification layers M are formed in the target wafer W. That is, in FIG. 29A to FIG. 29C, the horizontal direction indicates the circumferential direction of the boundary between the peripheral portion We and the central portion Wc and the vertical direction indicates the thickness direction of the target wafer W. Also, in FIG. 29A to FIG. 29C, dotted lines indicate modification layers M1 to M4 and show that the modification layers M1 to M4 are formed in the thickness direction of the target wafer W.

According to a processing method shown in FIG. 29A, in the processing unit 90, while the chuck 91 is rotated by the rotation mechanism 93, the laser beam is radiated from the first laser head 94 fixed in the vertical direction into the target wafer W to form the annular modification layer M4. Then, the rotation of the chuck 91 is stopped and the irradiation of the laser beam from the first laser head 94 is stopped and then, the first laser head 94 is moved up by the elevation mechanism 96 to a predetermined position, i.e., a position where the modification layer M3 is formed. Thereafter, while the chuck 91 is rotated, the laser beam is radiated from the first laser head 94 to form the annular modification layer M3. Here, the modification layers M2 and M1 are formed in the same manner, and, thus, the modification layers M1 to M4 are formed in the target wafer W.

Further, when the modification layers M1 to M4 are formed, the irradiation of the laser beam from the first laser head 94 may be controlled to be ON/OFF while the chuck 91 is continuously rotated. For example, while the chuck 91 is rotated, the laser beam is radiated from the first laser head 94 into the target wafer W to form the modification layer M4. Then, while the chuck 91 is continuously rotated, the irradiation of the laser beam from the first laser head 94 is stopped. Subsequently, the first laser head 94 is moved up and the first laser head 94 radiates the laser beam into the target wafer W to form the modification layer M3. Here, the irradiation start position and the irradiation end position of the laser beam for forming the modification layer M4 are stored, and, thus, the irradiation start position and the irradiation end position of the laser beam for subsequently forming the modification layer M3 can be adjusted. Further, since the rotation of the chuck 91 is not stopped as described above, the irradiation waiting time of the laser beam during the rotation acceleration and the rotation deceleration of the chuck 91 can be reduced, and, thus, the entire processing time can be reduced. Furthermore, since the rotation speed of the chuck 91 is maintained constant, the laser processing can be performed uniformly, and, thus, pitches of the modification layers M in the horizontal direction can be made equal.

According to a processing method shown in FIG. 29B, while the chuck 91 is rotated by the moving mechanism 92, the laser beam is radiated from the first laser head 94 fixed in the vertical direction into the target wafer W to form an annular modification layer M4. Before the forming of the modification layer M4 is ended, the first laser head 94 is moved up by the elevation mechanism 96 to a predetermined position, i.e., a position where the modification layer M3 is formed, while the chuck 91 is continuously rotated and the laser beam from the first laser head 94 is continuously radiated. Then, in a state where the position of the first laser head 94 in the vertical direction is fixed, the laser beam is radiated from the first laser head 94 while the chuck 91 is rotated to form the annular modification layer M3. Here, the modification layers M2 and M1 are formed in the same manner, and, thus, the modification layers M1 to M4 are formed in the target wafer W. In this case, the modification layers M1 to M4 can be consecutively formed, and, thus, the processing time can be reduced compared with the processing method shown in FIG. 29A.

According to a processing method shown in FIG. 29C, while the chuck 91 is rotated by the rotation mechanism 93 and the first laser head 94 is moved up by the elevation mechanism 96, the laser beam is radiated from the first laser head 94 into the target wafer W. Then, the annular modification layers M1 to M4 are consecutively formed. That is, in the present processing method, the modification layers M1 to M4 are consecutively formed into a spiral shape. Even in this case, the modification layers M1 to M4 can be consecutively formed, and, thus, the processing time can be reduced compared with the processing method shown in FIG. 29A. Also, the modification layers M1 to M4 do not have a steep slope when viewed from the side and thus can be uniformly formed in the vertical direction (the thickness direction of the target wafer W) compared with the processing method shown in FIG. 29B.

Figure 30:
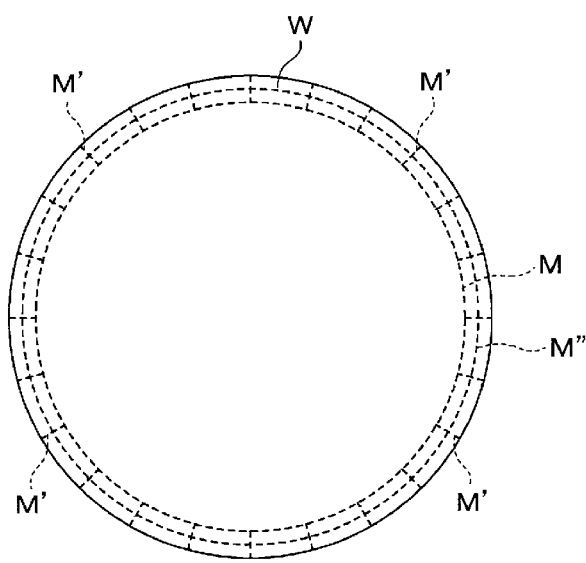
FIG. 30 is a plan view illustrating the modification layer formed in the target wafer according to still yet another exemplary embodiment.

According to the above-described exemplary embodiments, in the processing unit 90, the annular modification layer M is formed within the target wafer W. However, as shown in FIG. 30, a plurality of diametric directional modification layers M' elongated outwards in the diametric direction from the annular modification layer M may be further formed. In this case, for example, if the peripheral portion We is removed in the processing unit 90, the peripheral portion We is peeled off starting from the annular modification layer M and divided into a plurality of segments by the diametric directional modification layers M'. Thus, the peripheral portion We to be removed decreases in size and can be easily removed.

Further, to segment the peripheral portion We (edge segment) to be removed when the processing surface Wg is ground, a plurality of divided annular modification layers M" may be formed at a certain distance in a concentric direction with respect to the modification layer M as shown in FIG. 30. In this case, the size of the peripheral portion We to be removed can be further reduced. Also, by controlling the distance between the divided modification layers M" in the diametric direction, the size of segments of the peripheral portion We to be removed can be controlled.

Figure 31:
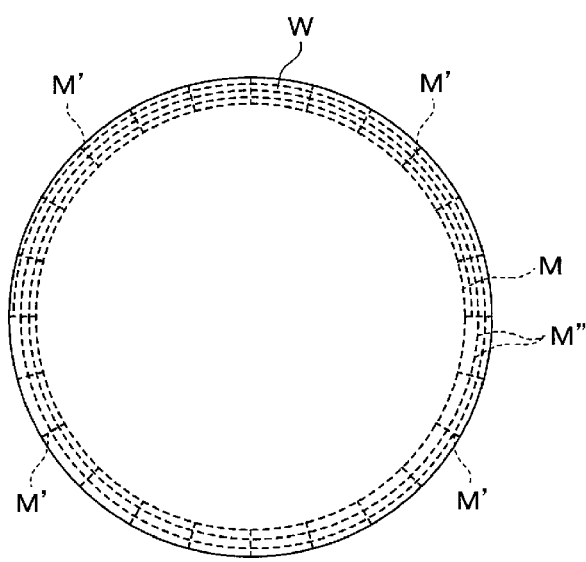
FIG. 31 is a plan view illustrating the modification layer formed in the target wafer according to still yet another exemplary embodiment.

Furthermore, if the divided annular modification layers M" are formed as described above, the divided modification layers M" may be formed into a spiral shape when viewed form the top as shown in FIG. 31. In this case, in the processing unit 90, while the chuck 91 or the first laser head 94 is moved in the horizontal direction and the chuck 91 is rotated, the laser beam is radiated from the first laser head 94 to the target wafer W. Thus, the divided modification layers M" can be consecutively formed into the spiral shape. As a result, it is possible to reduce the processing time.

Figure 32:
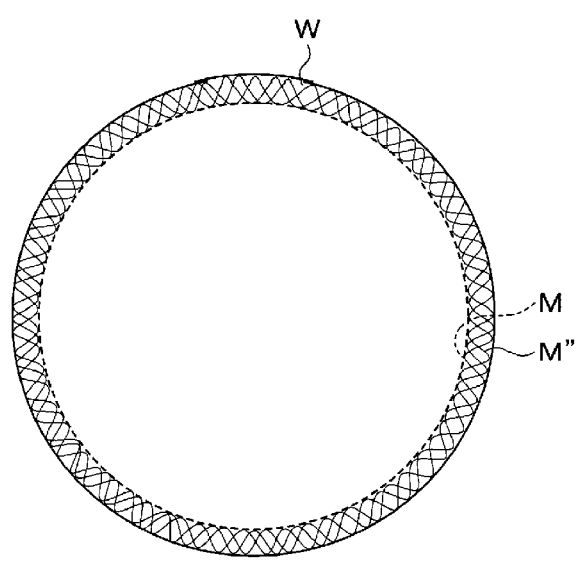
FIG. 32 is a plan view illustrating the modification layer formed in the target wafer according to still yet another exemplary embodiment.

Otherwise, the divided modification layers M" may be formed into a spiral shape and a zigzag shape when viewed from the top as shown in FIG. 32. In this case, in the processing unit 90, while the chuck 91 or the first laser head 94 is moved in the horizontal direction and the chuck 91 is rotated, the laser beam is radiated from the first laser head 94 to the target wafer W. Here, the phase, the cycle and the amplitude of the movement of the chuck 91 or the first laser head 94 are controlled, and, thus, the divided modification layers M" can be formed into the zigzag wave shape. Further, the divided modification layers M" are formed into two or more turns. Also, by controlling a shift and the number of turns of zigzag phases of the divided modification layers M", the size of segments of the peripheral portion We to be removed can be controlled. Further, in the present exemplary embodiment, the diametric directional modification layers M' shown in FIG. 30 and FIG. 31 are not necessary.

Figure 33A:
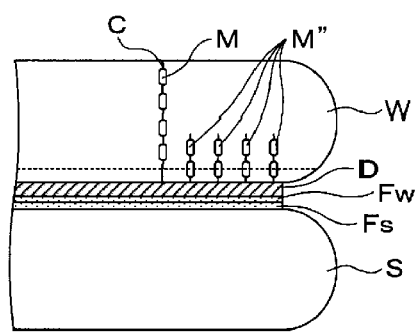
FIG. 33A and FIG. 33B are longitudinal cross sectional views illustrating the modification layer formed in the target wafer according to still yet another exemplary embodiment.
Figure 33B:
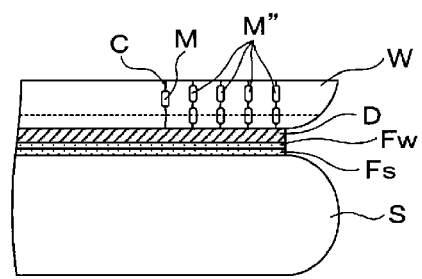

Furthermore, the divided modification layers M" may be formed such that the crack C extending from the divided modification layers M" can be elongated to a predetermined position within the target wafer W as shown in FIG. 33A. That is, the crack C reaches the non-processing surface Wn of the target wafer W, but does not reach the processing surface Wg. In this case, for example, when the rough grinding whetstone 132 is lowered to grind the processing surface Wg in the rough grinding unit 130, the processing surface Wg including the peripheral portion We of the target wafer W is ground as shown in FIG. 33B until the grinding surface of the rough grinding whetstone 132 reaches the crack C. Then, when the grinding surface of the rough grinding whetstone 132 reaches the crack C, the peripheral portion We located under the crack C is peeled off to be removed. As such, the height of the upper end of the crack C is adjusted to a predetermined position, and, thus, the size (height) of segments of the peripheral portion We to be removed can be controlled. Further, in the example shown in FIG. 33A and FIG. 33B, the divided modification layers M" are formed into two stages. However, by setting the number of focusing points from the first laser head 94 to two, the divided modification layers M" can be simultaneously formed into two stages while the chuck 91 is rotated.

Moreover, the substrate processing systems 1 and 200 according to the above-described exemplary embodiments may be equipped with a chemical mechanical polishing (CMP) device configured to polish the processing surface Wg of the target wafer W. In this case, a cleaning device configured to clean the processing surface Wg after being polished may also be provided. The CMP device may be provided, for example, on the negative side of the Y-axis direction of the wafer transfer section 30 in the processing station 3. Also, the cleaning device may be stacked on the wet etching devices 40 and 41, for example, on the positive side of the X-axis direction of the wafer transfer section 30.

According to the above-described exemplary embodiments, in the rough grinding unit 130 (or the rough grinding unit 130 and the intermediate grinding unit 140), the peripheral portion We of the target wafer W is removed, but the configuration of the periphery removing device is not limited thereto. For example, after the modification layer M is formed in the target wafer W, a force is applied to the outside of the modification layer M to remove the peripheral portion We. As such, the method of applying the force is arbitrary, but an impact is applied to the peripheral portion We, for example, by bringing a whetstone wheel (not shown) or a blade (not shown), or a brush (not shown) into contact with the peripheral portion We. Otherwise, water pressure or air pressure is applied to the peripheral portion We. Further, a tape (not shown) is attached to the peripheral portion We and pulled off from the peripheral portion We. Due to such an external force, the peripheral portion We is peeled off to be removed starting from the modification layer M and the crack C.

In the above-described exemplary embodiments, there has been described a case where the target wafer W and the support wafer S are directly bonded to each other. However, the target wafer W and the support wafer S may be bonded to each other via an adhesive.

The exemplary embodiments disclosed herein are illustrative and do not limit the present disclosure. Further, the above-described exemplary embodiments may be omitted, substituted, or changed in various forms without departing from the scope and spirit of the appended claims.

According to the present disclosure, the peripheral portion of one of the substrates which are bonded to each other to form the combined substrate can be appropriately removed.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

I claim:

1. A substrate processing method of processing a substrate, comprising:
    forming a modification layer within a first substrate along a boundary between a peripheral portion to be removed and a central portion of the first substrate, wherein the modification layer serves as a starting point of removing the peripheral portion of the first substrate; and
    performing a predetermined processing for reducing a bonding force at an interface where the first substrate and a second substrate are bonded to each other in the peripheral portion,
    wherein in the forming of the modification layer, the modification layer is formed more inwards in a diametric direction than a position corresponding to an end of the interface processed in the performing of the predetermined processing on the interface.

2. A substrate processing system that performs the substrate processing method according to claim 1, the substrate processing system comprising:
    a modification layer forming device configured to form a modification layer within a first substrate along a boundary between a peripheral portion to be removed and a central portion of the first substrate, wherein the modification layer serves as a starting point of removing the peripheral portion of the first substrate;
    an interface processing device configured to perform a predetermined processing for reducing a bonding force at an interface where the first substrate and a second substrate are bonded to each other in the peripheral portion; and
    a control device configured to control the modification layer forming device and the interface processing device,
    wherein the control device is further configured to control the modification layer forming device to form the modification layer more inwards in a diametric direction than a position corresponding to an end of the interface processed in the interface processing device.

3. The substrate processing system of claim 2, wherein the interface processed in the interface processing device is disposed inside of the first substrate.

4. The substrate processing system of claim 2, wherein a device layer including a plurality of devices is formed on a bonding surface of the first substrate to be bonded to the second substrate, and
the interface processed in the interface processing device is disposed inside of the device layer.

5. The substrate processing system of claim 2, wherein the interface processing device is further configured to modify the interface.

6. The substrate processing system of claim 2, further comprising:
    a periphery removing device configured to remove the peripheral portion of the first substrate, starting from the modification layer.

7. The substrate processing system of claim 2, wherein the control device is further configured to form the modification layer such that a lower end of the modification layer is located above a target surface of the first substrate after being ground.

8. The substrate processing system of claim 2, wherein the control device is further configured to:
    form the modification layer into a plurality of stages in a thickness direction of the first substrate, and
    form the modification layer such that a lower end of a lowermost modification layer of the plurality of stages of the modification layer is located above a target surface of the first substrate after being ground.

9. The substrate processing method of claim 1, wherein the interface processed in the performing of the predetermined processing is disposed inside of the first substrate.

10. The substrate processing method of claim 1, wherein a device layer including a plurality of devices is formed on a bonding surface of the first substrate to be bonded to the second substrate, and
the interface processed in the performing of the predetermined processing is disposed inside of the device layer.

11. The substrate processing method of claim 1, wherein in the performing of the predetermined processing on the interface, the interface is modified.

12. The substrate processing method of claim 1, further comprising:
    removing the peripheral portion, starting from the modification layer.

13. The substrate processing method of claim 1, wherein in the forming of the modification layer, the modification layer is formed such that a lower end of the modification layer is located above a target surface of the first substrate after being ground.

14. The substrate processing method of claim 1, wherein in the forming of the modification layer,
the modification layer is formed into a plurality of stages in a thickness direction of the first substrate, and
the modification layer is formed such that a lower end of a lowermost modification layer of the plurality of stages of the modification layer is located above a target surface of the first substrate after being ground.

* * * * *